United States Patent [19]
Ito et al.

[11] Patent Number: 5,547,787
[45] Date of Patent: Aug. 20, 1996

[54] EXPOSURE MASK, EXPOSURE MASK SUBSTRATE, METHOD FOR FABRICATING THE SAME, AND METHOD FOR FORMING PATTERN BASED ON EXPOSURE MASK

[75] Inventors: Shinichi Ito, Yokohama; Haruo Okano, Tokyo; Toru Watanabe; Katsuya Okumura, both of Yokohama, all of Japan

[73] Assignee: Kabushiki Kaisha Toshiba, Kawasaki, Japan

[21] Appl. No.: 49,788

[22] Filed: Apr. 21, 1993

[30] Foreign Application Priority Data

| Apr. 22, 1992 | [JP] | Japan | 102695 |
| Jul. 17, 1992 | [JP] | Japan | 191066 |
| Mar. 9, 1993 | [JP] | Japan | 48301 |

[51] Int. Cl.⁶ ........................ G03F 9/00
[52] U.S. Cl. ............... 430/5; 430/311; 430/312; 430/322
[58] Field of Search ............ 430/5, 311, 312, 430/322

[56] References Cited

U.S. PATENT DOCUMENTS

| 4,890,309 | 12/1989 | Smith et al. | |
| 4,902,899 | 2/1990 | Lin et al. | 430/5 |
| 5,286,581 | 2/1994 | Lee | 430/5 |

FOREIGN PATENT DOCUMENTS

| 3-144453 | 9/1991 | Japan |
| 4-136854 | 5/1992 | Japan |
| 4-162039 | 6/1992 | Japan |

*Primary Examiner*—S. Rosasco
*Attorney, Agent, or Firm*—Finnegan, Henderson, Farabow, Garrett & Dunner, L.L.P.

[57] ABSTRACT

An exposure mask having an excellent alignment accuracy between patterns, which is prepared by first forming on a light transmissive substrate a light shielding film or a semi-transparent film pattern (first pattern) somewhat larger than a desired dimension, forming thereon a semi-transparent film or a light transmissive film pattern (second pattern) so as to include all patterns of the desired dimensions made up of a light shielding part, a semi-transparent part and a light transmissive part, and then removing a projected part of the first pattern with use of the second pattern as a mask.

The semi-transparent film is formed of at least two layers each of which contains a common element, thus the semi-transparent film can be made with use of the same apparatus and when patterning, etching process can be carried out with use of the same etchant.

Further, since in a mask including the semi-transparent pattern, at least that area of non-pattern zone where light reaches a wafer through the transfer, acts to shield the exposure light, too narrowed pattern or insufficient focal depth can be prevented.

19 Claims, 29 Drawing Sheets

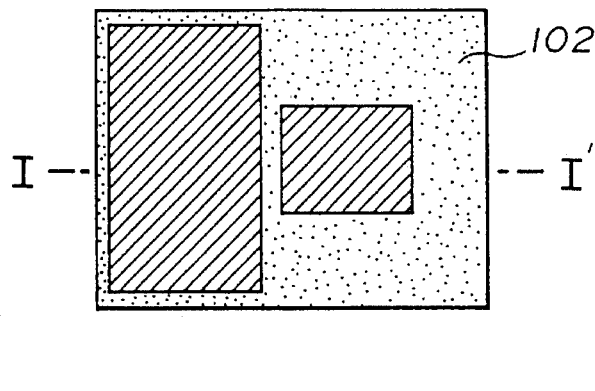 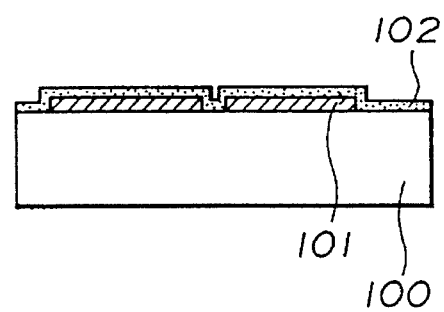
FIG.21(a)  FIG.21(b)
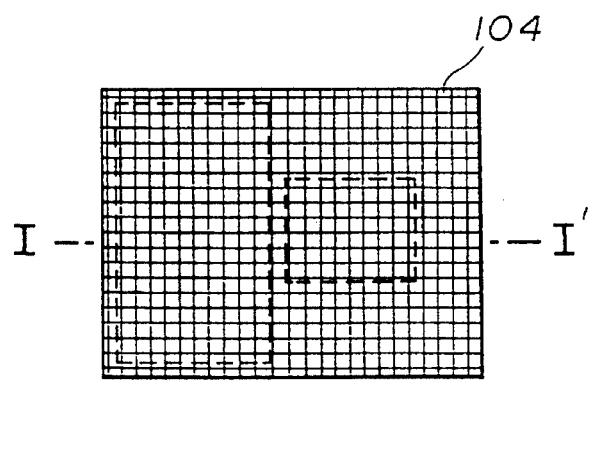 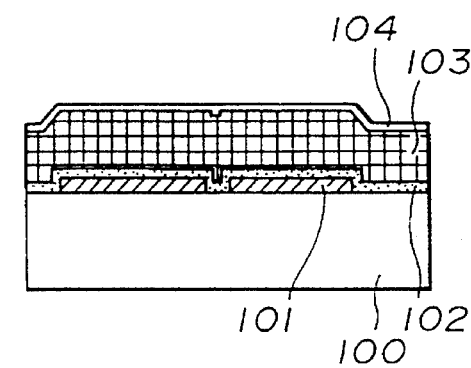
FIG.22(a)  FIG.22(b)

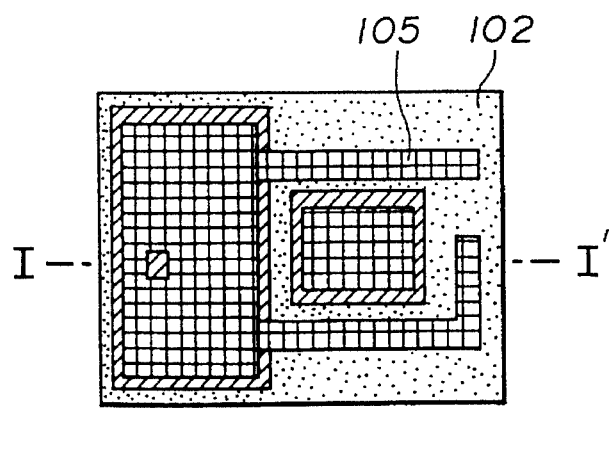
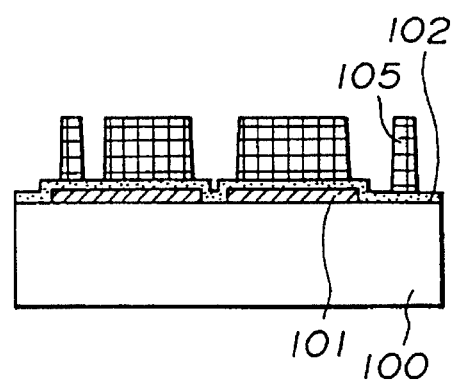
FIG.23(a)     FIG.23(b)
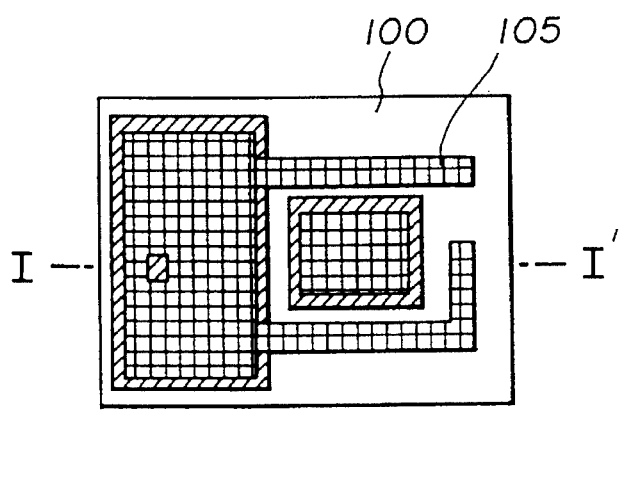
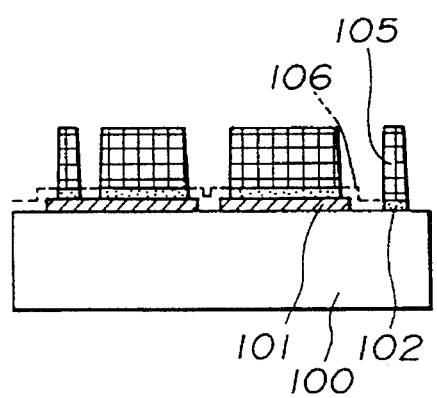
FIG.24(a)     FIG.24(b)

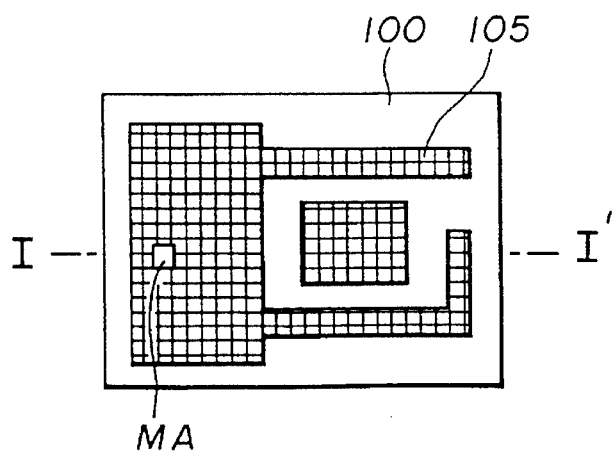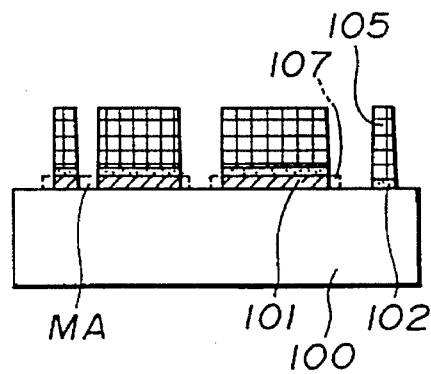
FIG.25(a)  FIG.25(b)
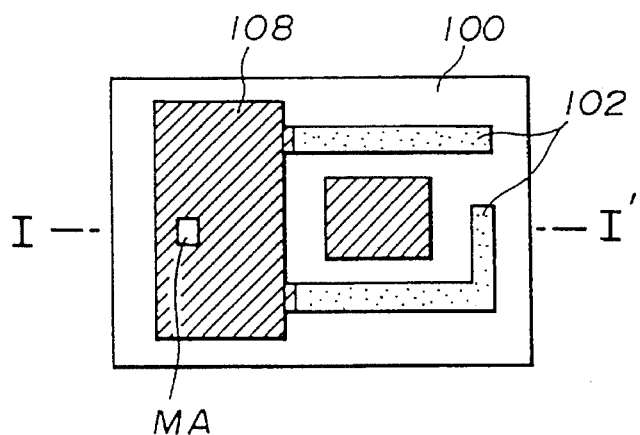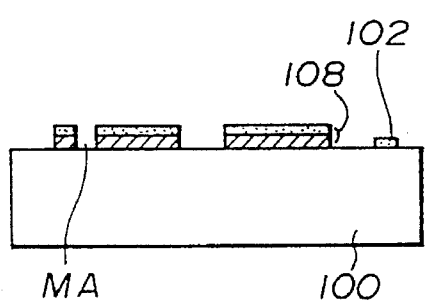
FIG.26(a)  FIG.26(b)

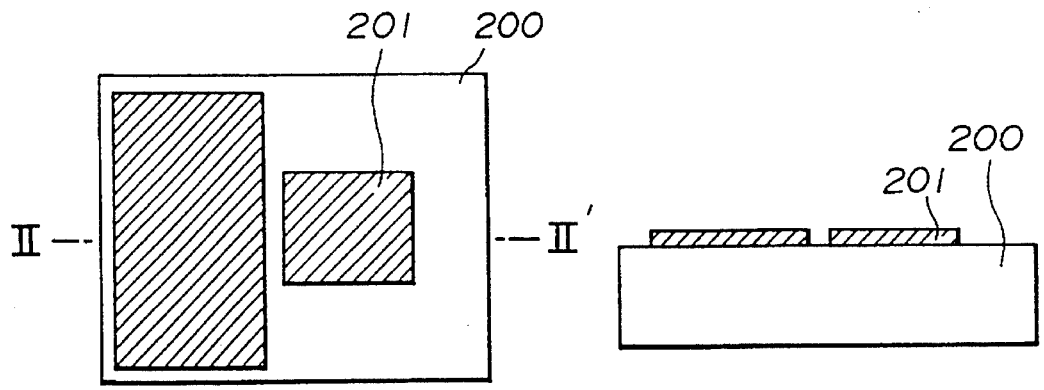
FIG.27(a)  FIG.27(b)
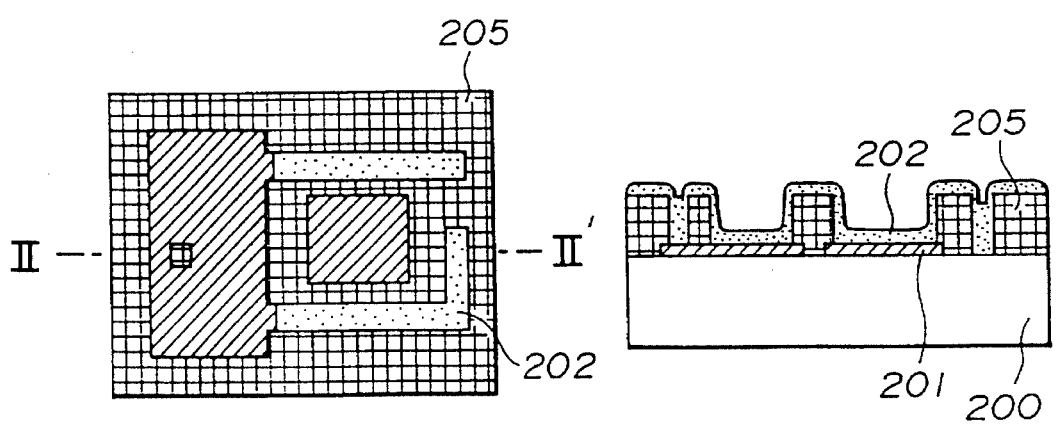
FIG.28(a)  FIG.28(b)

EXPOSURE MASK, EXPOSURE MASK SUBSTRATE, METHOD FOR FABRICATING THE SAME, AND METHOD FOR FORMING PATTERN BASED ON EXPOSURE MASK

BACKGROUND OF THE INVENTION

1. Field of the Invention

The present invention relates to an exposure mask, a projection exposure substrate for the exposure mask used in a lithography process of a semiconductor device, a method for manufacturing the mask and substrate, and a method for forming a pattern with use of the exposure mask.

2. Description of the Related Art

As semiconductor technology advances, operation speed and integration of a semiconductor device and thus semiconductor elements have been increased and enhanced. Accordingly, the necessity of making a lithographic pattern smaller has been increasingly demanded and thus pattern dimensions have been required to be made smaller with a higher accuracy. For the purpose of satisfying such demand, a light source using such short wave light as transmissive ultraviolet light has been employed as a stepper. In the process of a KrF excimer laser based on a 248 nm oscillation beam, which is expected as a stepper light source in the next generation; chemically-photosensitized resist has been developed as a resist material. However, this process is still in its experimental stage and thus it is difficult at the current stage to put it to practical use. In this way, when the wavelength of a stepper light source is changed, its development must be started from material development, which requires a considerable term until it can be put into practical use.

There have been proposed attempts to make a pattern smaller without changing its exposure light source (stepper). These attempts include, for example, a phase shift method. In this method, a phase inversion layer is partially provided to a light permeable part so that the influence of diffraction of light from an adjacent pattern is removed to thereby improve its pattern accuracy. This phase shift method is further divided into several methods, one of which, in particular, is known as Leverson method in which a difference in phase between adjacent two light permeable parts is alternately provided to be 180 degrees. In this method, however, it is difficult to exhibit the desired effects when three or more of patterns are provided adjacent to each other. That is, when a light phase difference between two patterns is set to be 180 degrees, one pattern becomes in phase with either one of the previous two patterns. As a result, disadvantageously, the patterns having a phase difference of 180 degrees can be solved but the patterns having a phase difference of 0 degrees cannot be solved. In order to eliminate this disadvantage, it becomes necessary to re-study the device design from its beginning and this involves considerable difficulties in putting it into practical use.

As another technique which is based on the phase shift method and eliminates the need for modifying the device design, the use of a half-tone phase shift mask having a light semi-transparent film as a phase reverse layer has been proposed. In order to maximize the merits of the phase shift method, it is important to optimize a phase difference between lights passed through a transparent part and a semi-transparent part as well as the amplitude transmissivity ratio of the transparent part and the semi-transparent part. The phase difference and amplitude transmissivity ratio are uniquely determined by the optical constants (complex refractive indexes n–ik: i being unit imaginary number) of these parts and the thicknesses of the films. In other words, in order to obtain a desired phase differences, and amplitude transmissivity ratio, it is necessary to satisfy the relationship between the optical constants and film thicknesses. However, since the optical constant is inherent or intrinsic in the film material, it is difficult to satisfy the relationship with a single layer film.

FIG. 45 shows a structure of an ideal half-tone phase shift film. A mask prepared according to this method comprises a light transmissive substrate 1 having a light transparent part 1a and a light semi-transparent part 1b formed on the substrate. The light semi-transparent part 1b is formed to have an amplitude transmissivity of 10 to 40% with respect to the light transparent part 1a, and at the same time the phase of light passing through the light semi-transparent part 1b is changed by 180 degrees with respect to the light permeable part 1a. To this end, the light semi-transparent film 1b is of a two-layer structure which comprises a first layer 2 for satisfying the above-mentioned purpose and a second layer 3 for adjusting a total of phase differences of the first and second layers to be 180 degrees.

In this way, in the prior art half-tone phase shift mask, the half-tone part has the two-layer structure, the amplitude transmissivity is adjusted by the first layer 2, and the phase difference is adjusted by the second layer 3 so that a total of the phase differences of the first and second layers becomes 180 degrees. And the first layer is made of Cr, MoSi or the like, while the second layer is made of $SiO_2$, $MgF_2$, $CaF_2$, $Al_2O_3$ or the like. Accordingly, in order to form the half-tone part, it is necessary to perform film formation in two different environments. For example, a sputtering system is used to form a Cr film as the first layer, while a chemical vapor deposition (CVD) process is used to form an $SiO_2$ film as the second layer.

However, this sort of method is disadvantageous in that the film formation is carried out twice separately, which results in undesirable attachment of dust during transportation of the film and thus an increase in the number of defects in the resultant film. Further, this method has a processing problem that, since different elements must be used for the formation of the films, etching must be carried out with use of a plurality of different sorts of gases (for example, when it is desired to form Cr and $SiO_2$ layers as the semi-permeable film, the Cr layer is processed with use of a Cl-series gas whereas the $SiO_2$ layer is processed with use of a fluorine-series gas). Further, though the second layer is made of a transparent film, since the transparent film has a small refractive index, the thickness of the phase shifter film must be large. For this reason, its processing accuracy becomes bad.

In addition, for the purpose of preventing leakage of exposure light from an aligning or inspecting mark which is present on an area other than the pattern area on the mask in a light exposure process, a blind is provided to a projection aligner to cut off any light from the area other than the pattern area. In this connection, since the blind causes formation of a blur or dim image of about 100 μm on the wafer, so that the blind cannot serve to define or mark off the pattern area on the wafer. For this reason, in the prior art, a light shielding pattern 101 is formed so as to surround the outer periphery of the pattern area on the mask, as shown in FIG. 46(a). However, when the exposure mask is made of only the semi-permeable film, such a semi-transparent pattern 201 is used in place of the light shielding pattern for marking off the pattern area which is present at the outer periphery of the pattern area, as shown in FIG. 46(b). In this case, the light passed through the semi-transparent film present at the boundary of the pattern area is irradiated on the wafer against adjacent patterns by an amount corresponding to the transmissivity of the semi-transparent film times the amount of exposure light. For this reason, this involves such a problem that, for the irradiation area, the amount of exposure light becomes substantially excessive so that the pattern area becomes too narrow and further its focal depth becomes insufficient, as shown in FIG. 47.

In this way, the prior art phase shift mask of the half-tone type has had such a problem that the formation of the semi-transparent film requires a number of necessary steps and also causes the attachment of dust to the film and generation of defects therein, which results in difficulty in exhibiting the maximum phase shift effects.

Further, when the exposure mask is made of only the semi-transparent film, the semi-transparent pattern is used even for the outer periphery of the pattern area which is intended to mark off the pattern area. Thus, the light passed through the semi-transparent film present at the boundary of the pattern area is irradiated on the wafer against an adjacent pattern by an amount corresponding to the transmissivity of the semi-transparent film times the amount of exposure light. For this reason, this involves such a problem that, for the irradiation area, the amount of exposure light becomes substantially excessive so that the pattern area becomes too narrow and further its focal depth becomes insufficient.

In the case of using a shifter edge type phase shift mask, a relatively large pattern is made of a light shielding film, while a fine pattern is made of a transparent film which has a light transmissivity of 100% and the phase of light passing through which is different by 180 degrees with respect to a substrate.

However, even the use of the shifter edge type phase shift mask or the half-tone type phase shift mask has had such a problem that, when a relatively large pattern is made of a light shielding film and a relatively small pattern is made of a phase shifter, that is, when the single mask comprises the light shielding film, semi-transparent film and transparent film, these films are formed conventionally through independent exposure processes, which results in that a relative position aligning accuracy between the films is reduced.

In addition, in this technique, it is difficult to exhibit its effects when three or more patterns are positioned adjacent to each other. In other words, when two patterns have a light phase difference of 180 degrees therebetween, one of the two patterns is in phase with either one of the previous two pattern. This results disadvantageously in that the patterns having a phase difference of 180 degrees can be solved but the patterns having a phase difference of 0 degrees cannot be solved. This advantage cannot be solved without re-studying the device design from its beginning, thus, it requires considerable difficulties to immediately put into its practical use.

SUMMARY OF THE INVENTION

In view of the above circumstances, it is an object of the present invention to provide an exposure mask and a method for manufacturing the mask which allows easy stacking of a plurality of semi-transparent film layers while preventing undesirable attachment of dust thereto and generation of defects therein, which can simplify its steps and exhibit the maximum phase shift effects.

In accordance with a first aspect of the present invention, there is provided an exposure mask having a mask pattern formed on a light transmissive substrate, in which the mask pattern includes a semi-transparent film pattern arranged so that a ratio of an optical path length of the semi-transparent film pattern to a wavelength of exposure light is differentiated by a predetermined amount from that of a transparent part of the light transmissive substrate, and the semi-transparent film pattern comprises stacked layers of different composition materials respectively containing an identical element.

In accordance with a second aspect of the present invention, there is provided a method for manufacturing an exposure mask having a mask pattern including a semi-transparent film formed on a light transmissive substrate so that a ratio of an optical path length of the semi-transparent film to a wave length of exposure light is differentiated by a predetermined amount from a transparent part of the light transmissive substrate, in which the semi-transparent film is formed by sequentially stacking layers of different composition materials respectively containing an identical element.

Preferable embodiments of the present invention includes:

(1) The semi-transparent film comprises a plurality of layers of substances, in controlled composition ratio, made of one or a mixture of two or more selected from the group of silicon, silicon compound, silicon-contained mixture, germanium, germanium compound, and germanium-contained mixture: or substances made of one or a mixture of two or more selected from the group of Cr, Al, Ti, Sn, In, Co or other metal element, metal compound, oxides, nitrides, hydrides, carbonides, and halides thereof.

(2) At least one of the plurality of layers of the semi-transparent film is formed by a sputtering process in an atmosphere mixed therein with such a gas as nitrogen, oxygen, hydrogen and acetylene or such a gas containing halogen elements. An amplitude transmissivity is adjusted and the other layers are formed by controlling the composition ratio of nitrogen, oxygen or halogen elements.

(3) The semi-transparent film pattern thus formed is further subjected to such a modification step as an ion implantation process or a heat treatment process to change to its crystalline state, whereby the amplitude transmissivity is finely adjusted.

In the present invention, since the semi-transparent film is made up of at least two layers and the respective layers contain a common element, the semi-transparent film can be formed by means of the same device. Further, even when the semi-transparent film is subjected to a patterning process, its etching process can be carried out with use of the same sort of etchant. Thus, the process for forming the semi-transparent film can be simplified. Further, there sometimes occurs such a case that, even when the composition of a single layer as the semi-transparent film providing a desired amplitude transmissivity and phase difference is known, it is difficult to realize such composition material. In such a case, when the entire composition of a plurality of layers having different compositions is set to be equal to the composition of the above single layer, an equivalent layer can be formed with the plurality of layers which are stable and easy to form. In other words, when the semi-transparent film is made up of a plurality of sorts of layers each containing an identical element as in the present invention, its manufacturing steps can be simplified and the phase shift effect can be exhibited to its maximum level.

It is another object of the present invention to provide an exposure mask which can prevent too narrowed pattern zone and insufficient focus depth even when the exposure mask is made up of only a semi-transparent film.

In a third aspect of the present invention, there is provided an exposure mask having a mask pattern formed on a light transmissive substrate, in which the mask pattern includes a semi-transparent film pattern arranged so that a ratio of an optical path length of the semi-transparent film pattern to a wave length of exposure light is differentiated by a predetermined amount from that of a transparent part of the light transmissive substrate, and a semi-transparent film or a light shielding film is further stacked on part or whole of the semi-transparent film pattern.

That is, the exposure mask of the present invention comprises a semi-transparent pattern of a first semi-transparent film made of a single layer or a multi-layer and formed on a light transmissive substrate the semi-transparent transparent film being adjusted so as to have a phase difference with a transparent part of the light transmissive substrate within a range of 180±10 degrees and to have an amplitude transmissivity of 10 to 40%, and a light shielding layer or a second semi-transparent film having an amplitude transmissivity of 10 to 40% stacked on a partial zone of the semi-transparent pattern so as to adjust the partial zone to have an amplitude transmissivity of below 5%.

It is desirable that the partial zone at least includes an outer peripheral part of a zone formed as a semiconductor element when transferred onto a wafer.

Desirably, the first semi-transparent film forming the phase shift layer and the second semi-transparent film formed on the phase shift layer contain the same composition.

Further, it is desirable that the first semi-transparent film forming the phase shift layer and the second semi-transparent film formed on the phase shift layer contain the same element.

The stacked zone is set to be desirably out of a zone to be transferred on the wafer.

In this case, the first semi-transparent film pattern may be of a single layer whose refractive index n and attenuation coefficient k are adjusted so that the optical path length of the single layer is differentiated by a predetermined amount from that of the transparent part of the light transmissive substrate or may be a multi-layer in which one layer is adapted to adjust only the refractive index n and the other layer is adapted to adjust the attenuation coefficient k.

In the third aspect of the invention, since, in a mask including the semi-transparent pattern, at least that area of the non-pattern zone where light reaches the wafer through the transfer, acts to shield the exposure light, too narrowed pattern or insufficient focal depth can be prevented. For example, a result of exposure to a positive resist with use of an i-ray semi-transparent mask having an intensity transmissivity of 2% has showed that, when a pattern changed to a desired dimension with use of a 0.55 μm line-and-space pattern was further irradiated for one time with light corresponding to the intensity transmissivity of the mask times the amount of exposure light, the pattern dimension was reduced to 0.49 μm which corresponds to about 10% reduction to the desired value. With the above structure, however, the part of the non-pattern zone where light reaches the wafer through transfer can act to shield the exposure light. The semi-transparent film for light shielding can also be used in the pattern zone. That is, in case where the film thickness of the resist pattern on the wafer formed with use of the semi-transparent mask pattern is remarkably reduced by a plurality of exposure operations, the semi-transparent film can be stacked on the zone other than the edge part of the semi-transparent pattern so that the reduction of the resist pattern film can be minimized.

In accordance with a fourth aspect of the present invention, there is provided an exposure mask substrate which comprises: a first semi-transparent film of a single semi-transparent layer or a multi-layer comprising at least a semi-transparent layer and a transparent layer formed on a light transmissive substrate, the first semi-transparent film being adjusted so as to have a phase difference with a transparent part of the light transmissive substrate set within a range of 180±10 degrees and to have an amplitude transmissivity of 10 to 40%; a light shielding layer or a second semi-transparent film having an amplitude transmissivity of 10 to 40% stacked on an entire or partial zone of the first semi-transparent film and being adjusted so that the entire or the partial zone has an overall amplitude transmissivity of below 5%; and at least one of an oxide film, a nitride film, a hydride film, a carbonide film and a halogenide film disposed between the first and second semi-transparent films.

In accordance with a fifth aspect of the present invention, there is provided a method for manufacturing an exposure mask, which comprises the steps of forming on a light transmissive substrate a first semi-transparent film of a single semi-transparent layer or a multi-layer comprised of at least a semi-transparent layer and a transparent layer, the first semi-transparent film being adjusted so as to have phase difference with a transparent part of the light transmissive substrate set within a range of 180±10 degrees and to have an amplitude transmissivity of 10 to 40%, forming a third film comprised of an electrically conductive film or an oxide film on the first semi-transparent film, forming on the third film a light shielding layer or a second semi-transparent film having an amplitude transmissivity of 10 to 40% being adjusted so that an overall amplitude transmissivity becomes below 5%, and selectively removing by etching the second semi-transparent film with use of the third film as an etching stopper.

In accordance with the fourth and fifth aspects of the present invention, since the oxide film or the electrically conductive film is disposed between the first semi-transparent layer which constitutes the phase shift layer and the second semi-transparent film, the oxide film or the electrically conductive film acts as the etching stopper, whereby the second semi-transparent film is selectively removed while keeping the phase shift layer in its good condition. As a result, there can be formed an excellent exposure mask without the narrowed pattern and insufficient focus depth.

In the case of using the oxide film, it is only required to perform surface oxidization within the same chamber and thus formation can be highly facilitated. In the case of using the electrically conductive film, charge-up can be prevented. It is desirable to dispose the electrically conductive film between the phase shift layer and the semi-transparent layer or light shielding layer.

Another object of the present invention is to provide a method for manufacturing an exposure mask which has a good alignment accuracy between patterns as well as to provide a method for forming a pattern with use of the substrate.

In accordance with a sixth aspect of the present invention, there is provided a method for manufacturing an exposure mask which comprises the steps of forming a first film on a light transmissive substrate to be somewhat larger than a first pattern to be formed, forming on the light transmissive substrate and the first film a second film having an intensity transmissivity higher than that of the first film, forming a resist pattern corresponding to the first pattern and a second pattern to be formed on the second film, removing the second film and then the first film with use of the resist pattern as a mask so as to form the first pattern made of the first film and the second film stacked on the first film and the second pattern made of the only second film, and removing the resist pattern.

In accordance with a seventh aspect of the present invention, there is provided a method for manufacturing an exposure mask which comprises the steps of forming a first film on a light transmissive substrate to be somewhat larger than a first pattern to be formed, forming a resist layer on the light transmissive substrate having the first film thereon and then removing a part of the resist layer corresponding to the first pattern and a second pattern to be formed to thereby form a groove, forming in the groove a second film having an intensity transmissivity higher than that of the first film, removing the resist layer and the second film on the resist layer, and removing the first film with use of the second film as a mask so as to form the first pattern made of the first film and the second film stacked on the first film and the second pattern made on the only second film.

In accordance with an eighth aspect of the present invention, there is provided a method for manufacturing an exposure mask which comprises the steps of forming a first film on a light transmissive substrate to be somewhat larger than a first pattern to be formed, forming a resist layer on the light transmissive substrate having the first film thereon and removing a part of the resist layer larger to form a groove to thereby expose a surface of the light transmissive substrate which surface being larger than a portion corresponding to a second pattern to be formed, forming in the groove a second film, removing the resist layer to form a resist pattern, removing the second film and then the first film with use of the resist pattern as a mask so as to form the first pattern made of the first film and the second pattern made of the second film, and removing the resist pattern.

According to this method, an exposure mask which has an excellent alignment accuracy between patterns, can be manufactured by first forming on light transmissive substrate a light shielding film or a semi-transparent film pattern (first pattern) somewhat larger than a desired dimension, forming thereon a semi-transparent film or a light transmissive film pattern (second pattern) so as to include patterns of the desired dimensions made up of a light shielding part, a semi-transparent part and a light transmissive part, and then removing a projected part of the first pattern with use of the second pattern as a mask.

Figure 5A:
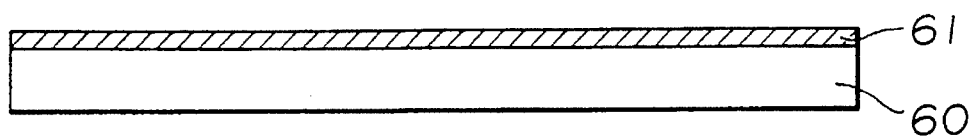
Figure 5B:
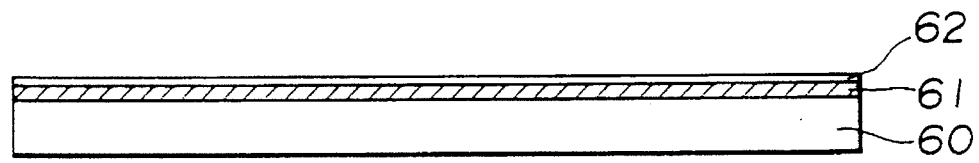
Figure 5C:
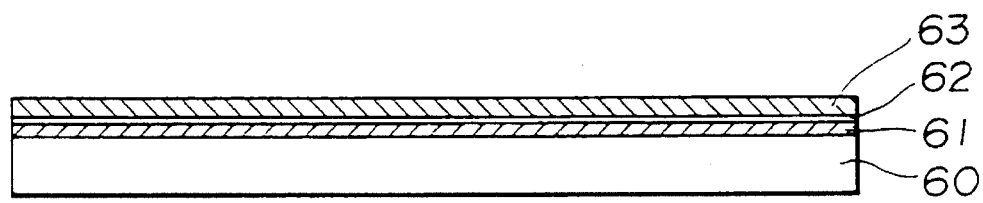
Figure 7A:
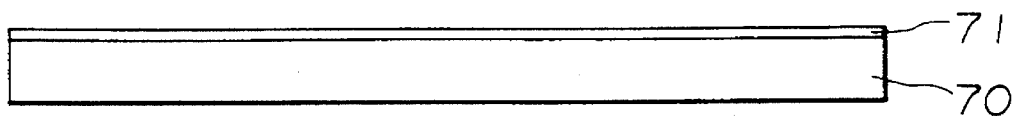
Figure 7B:
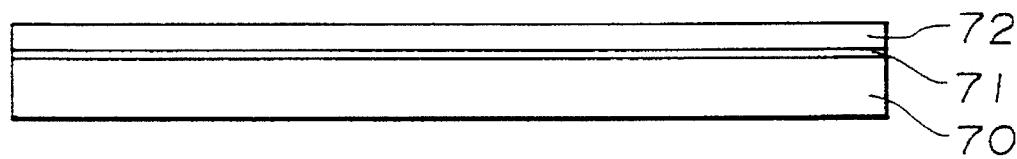
Figure 7C:
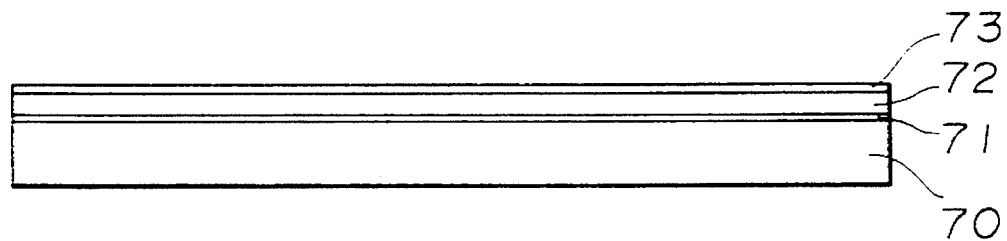
Figure 9A:
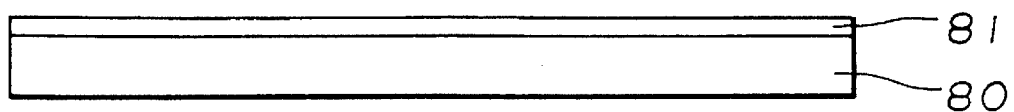
Figure 9B:
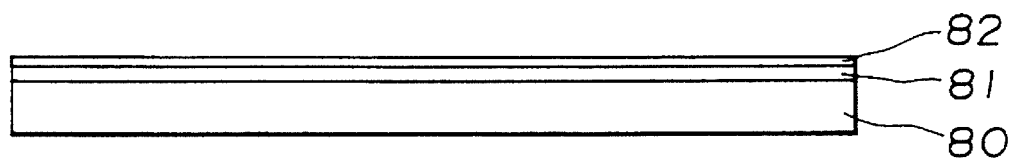
Figure 9C:
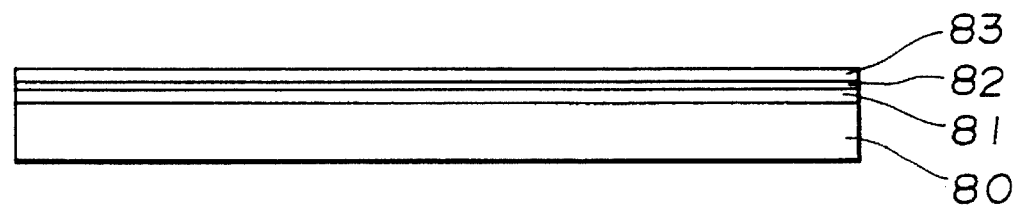
Figure 12:
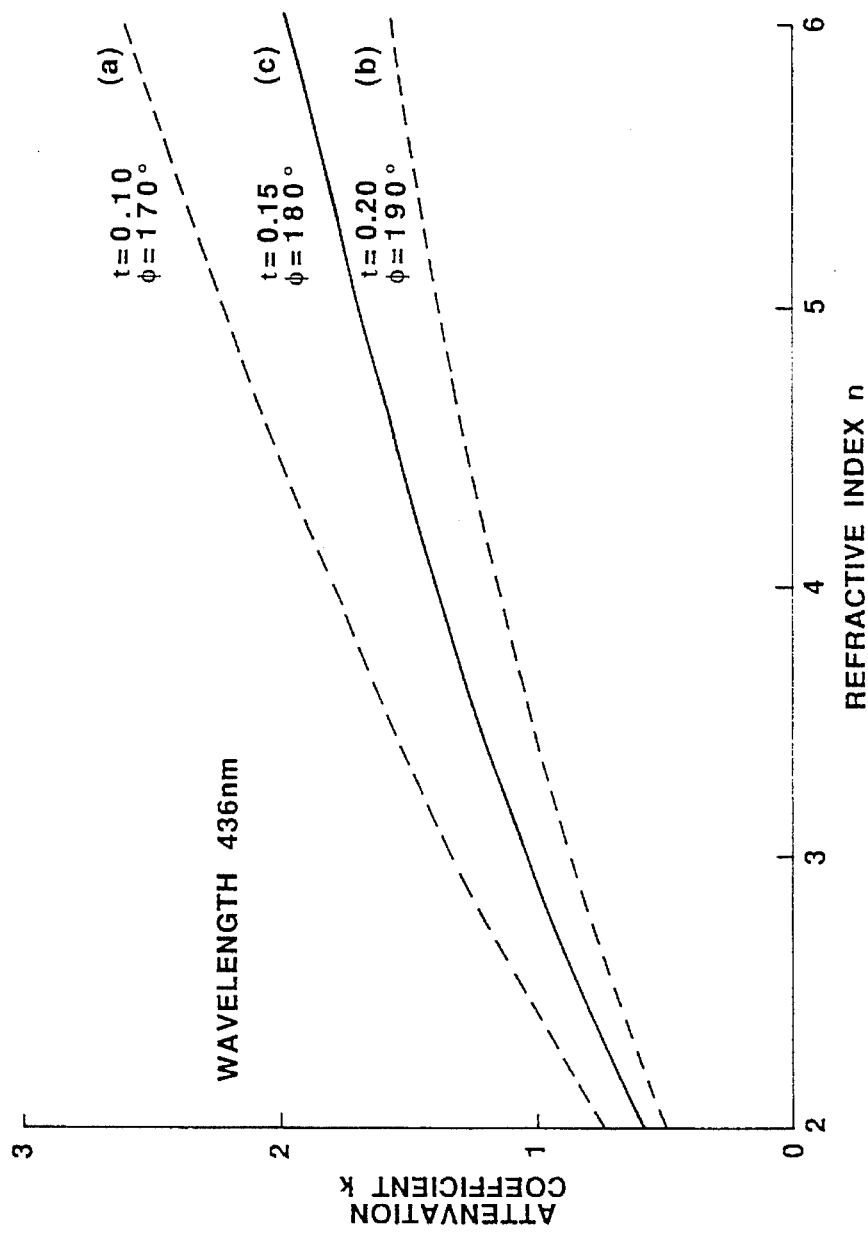
Figure 13:
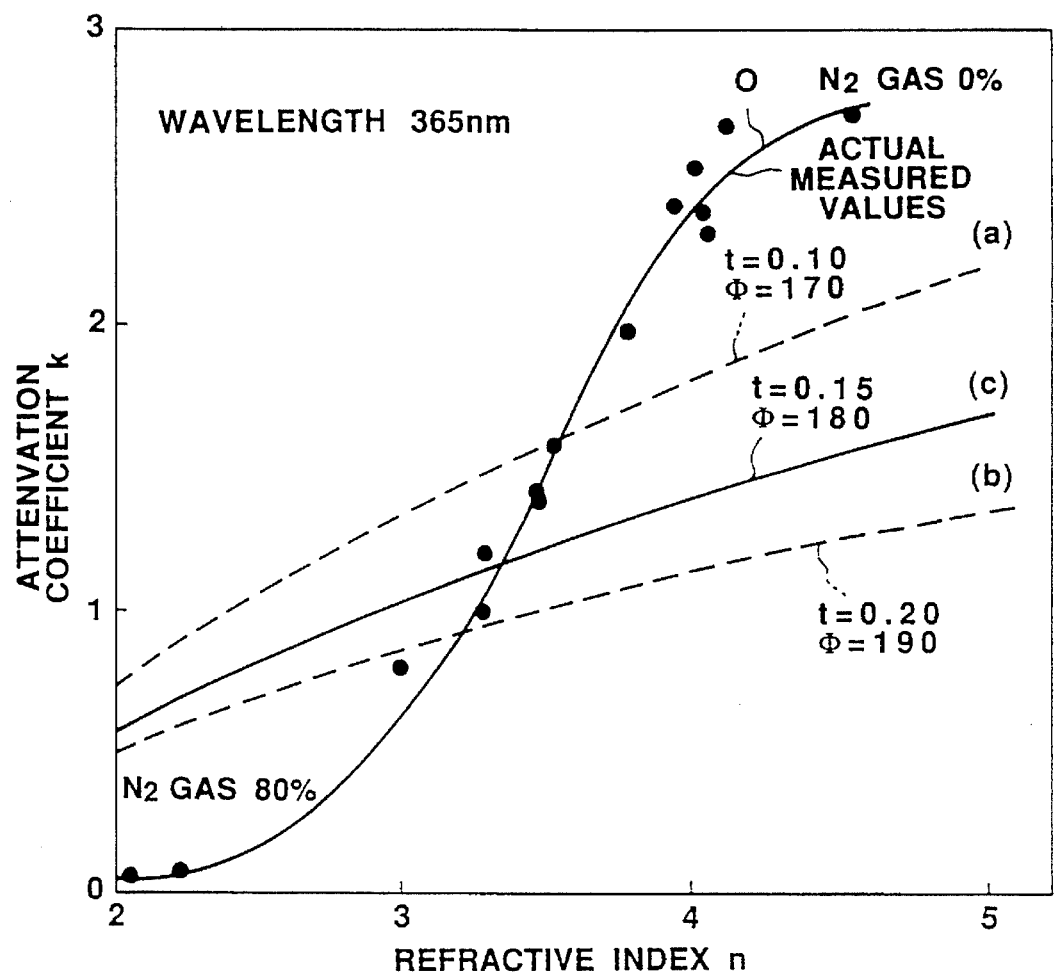
Figure 14:
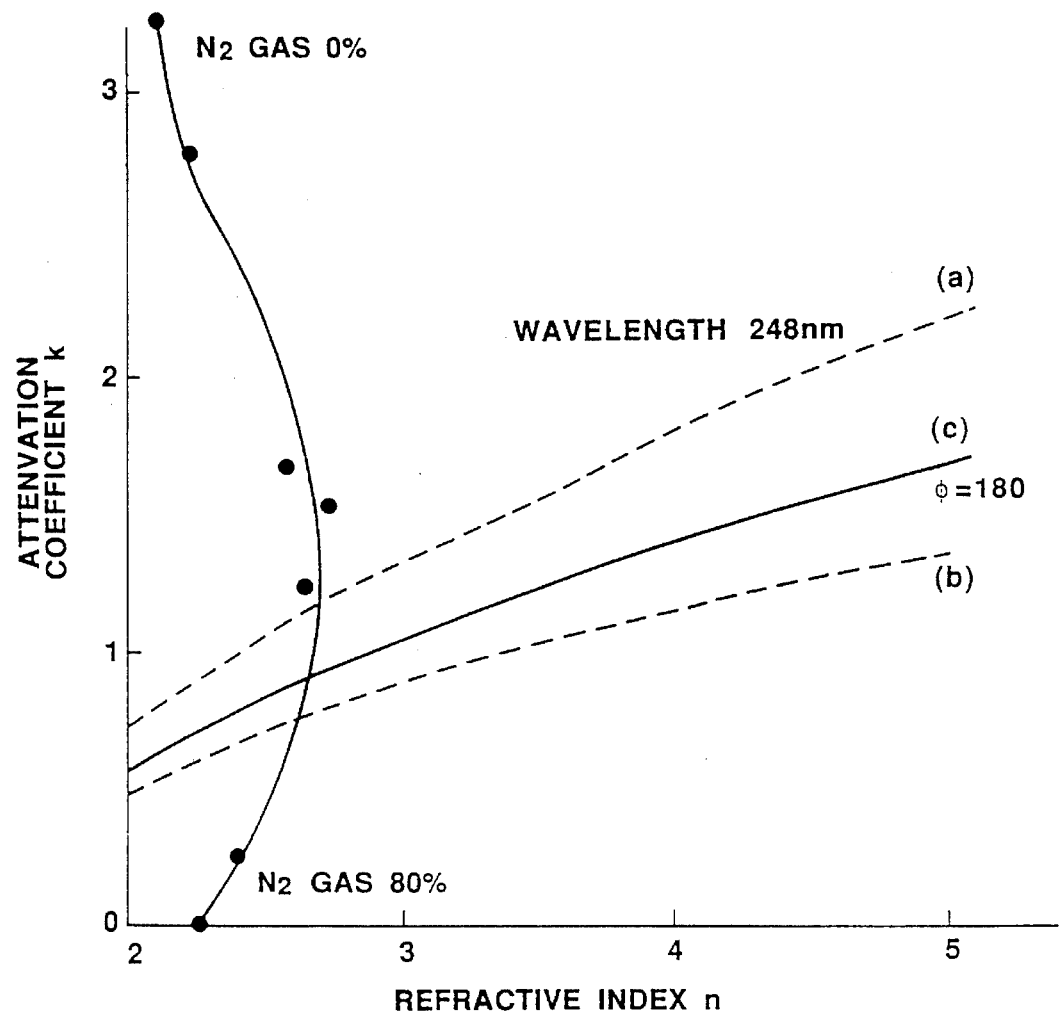
Figure 15A:
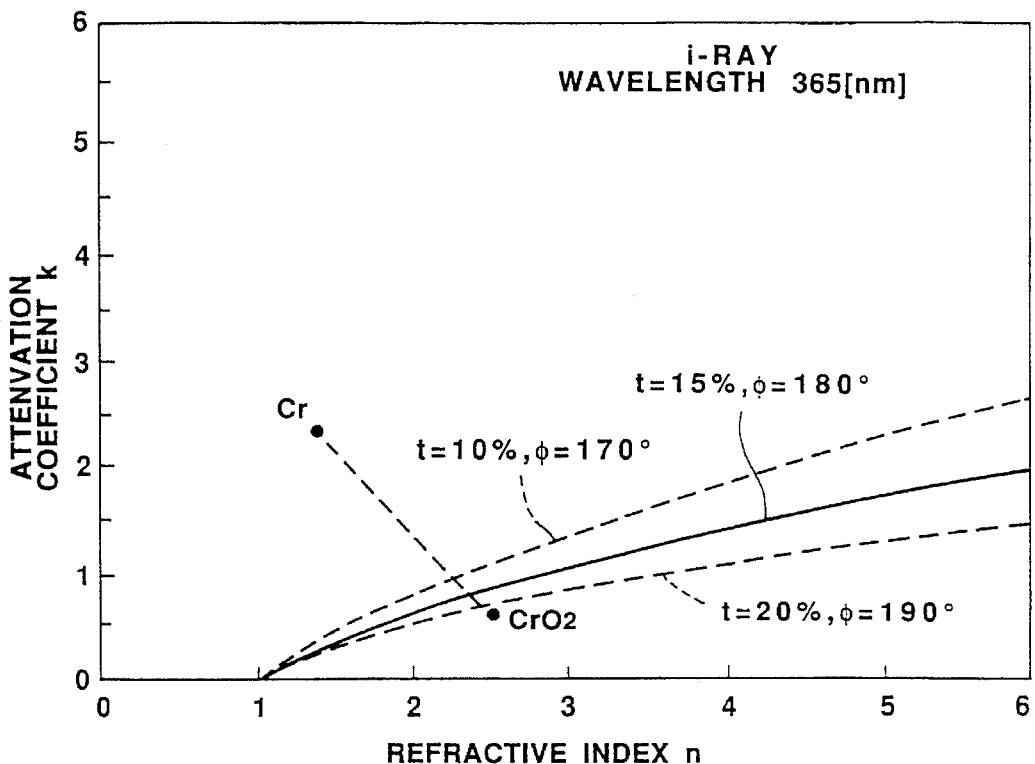
Figure 15B:
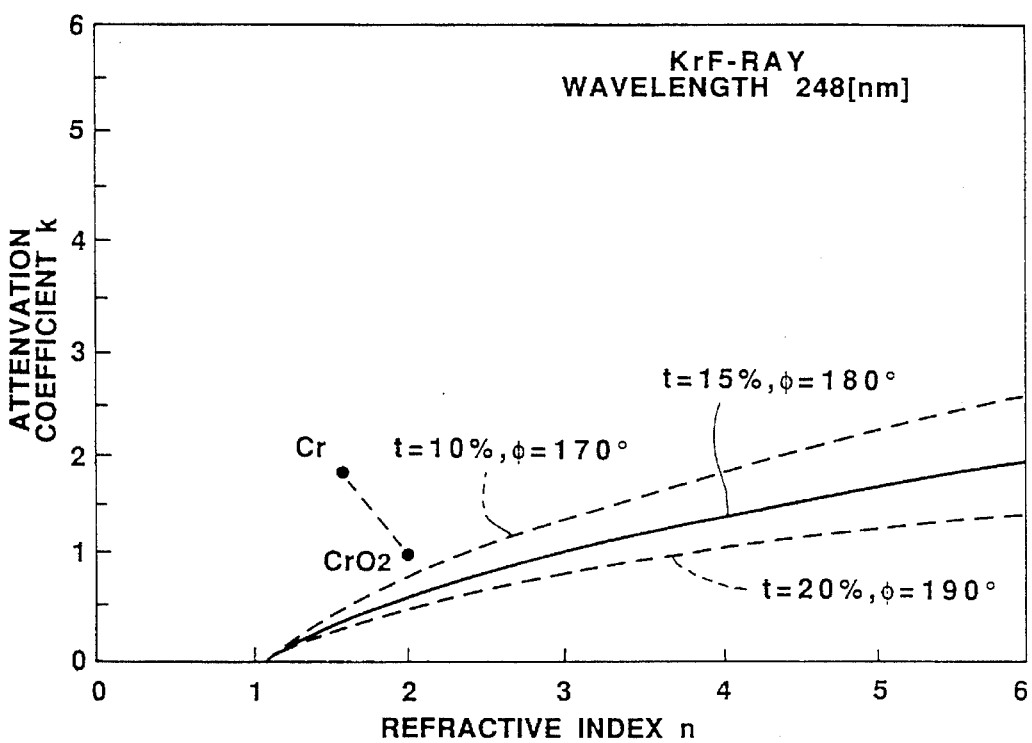
Figure 16A:
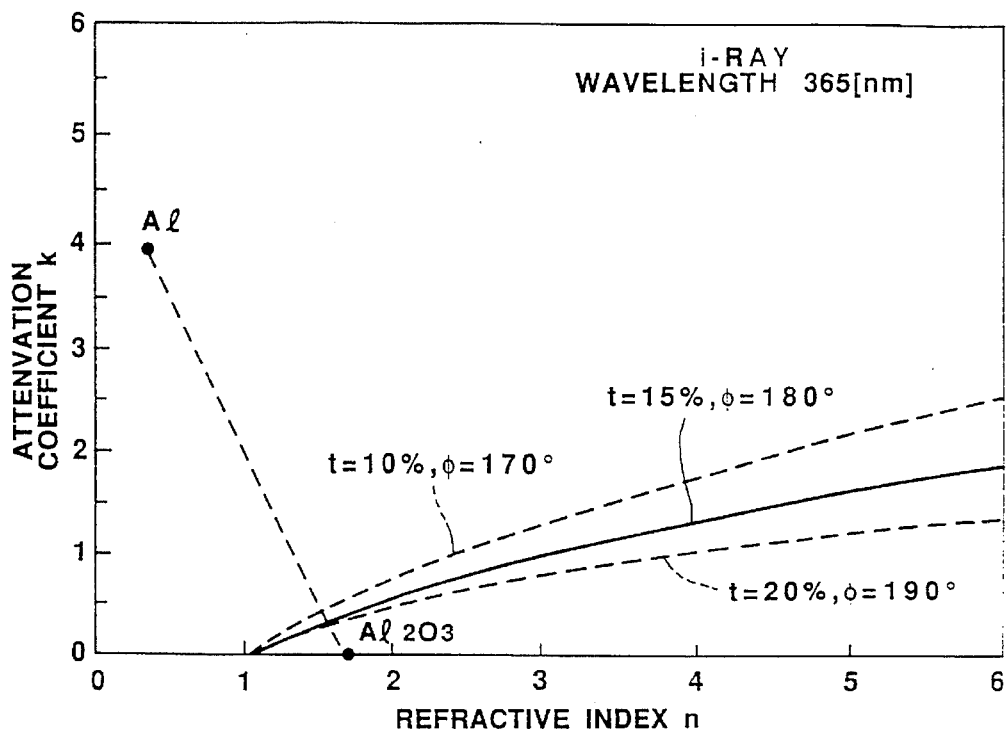
Figure 16B:
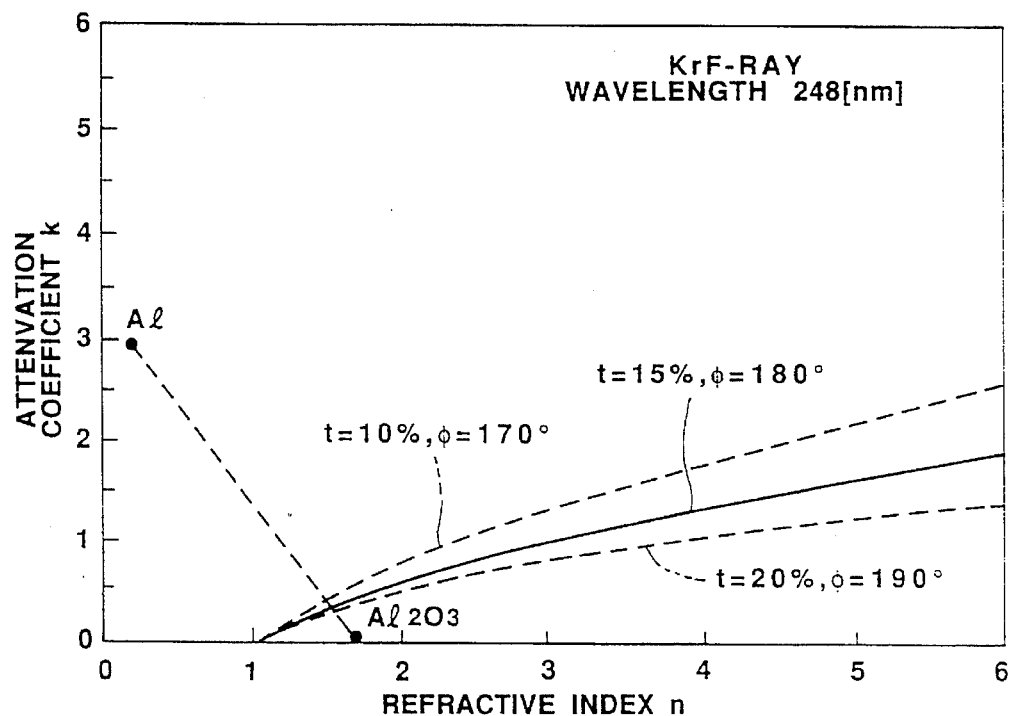
Figure 17A:
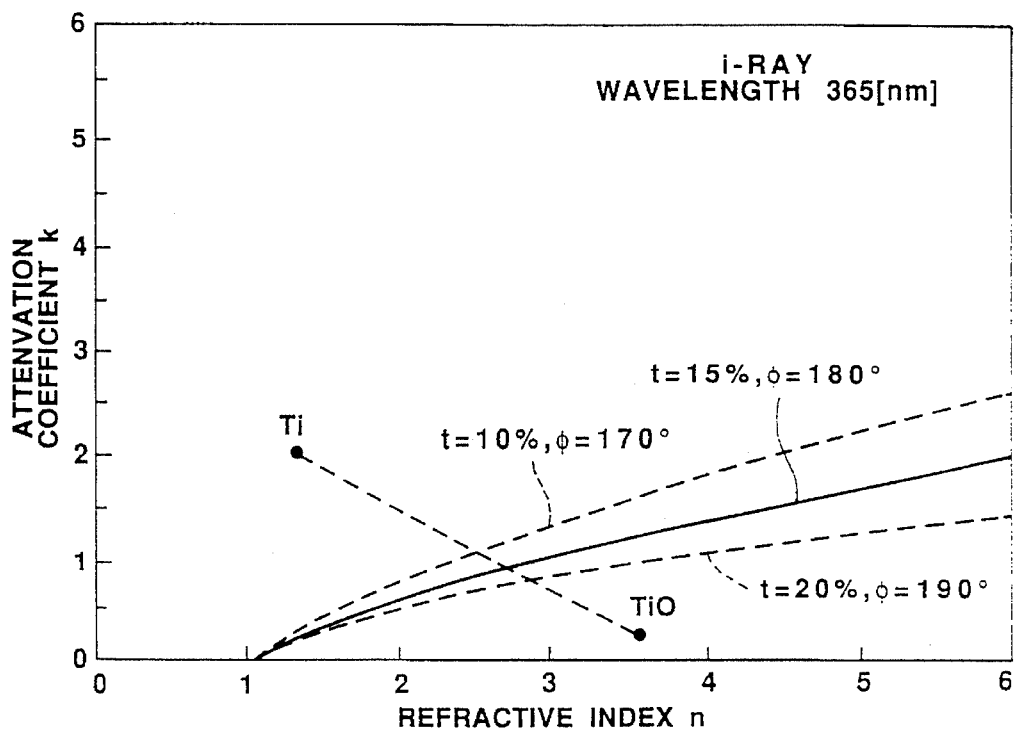
Figure 17B:
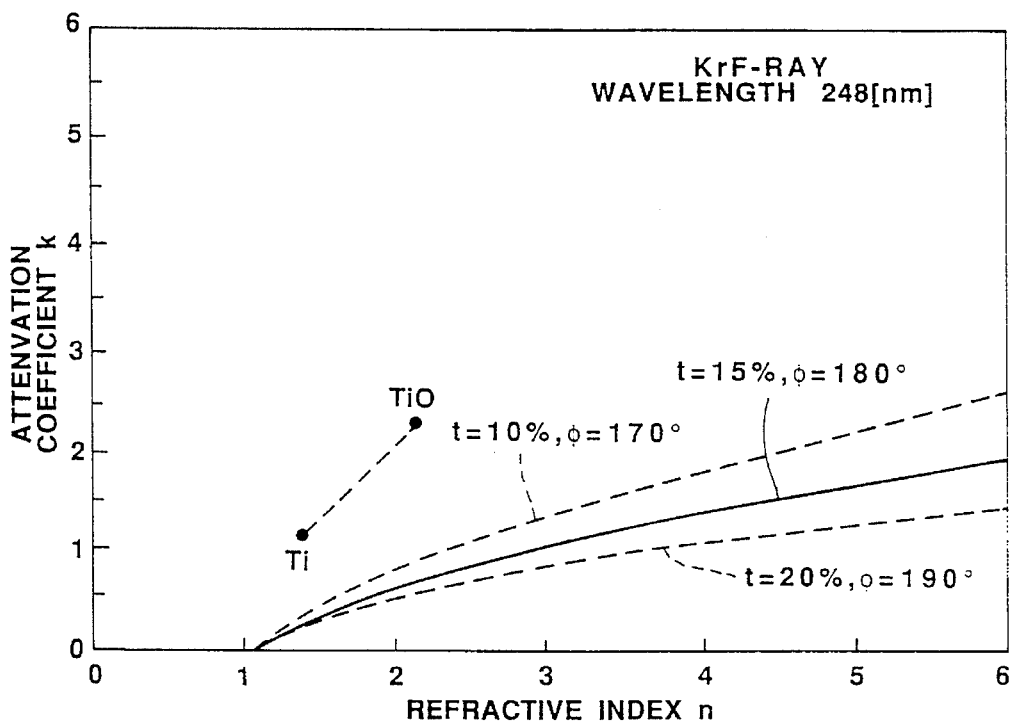
Figure 18A:
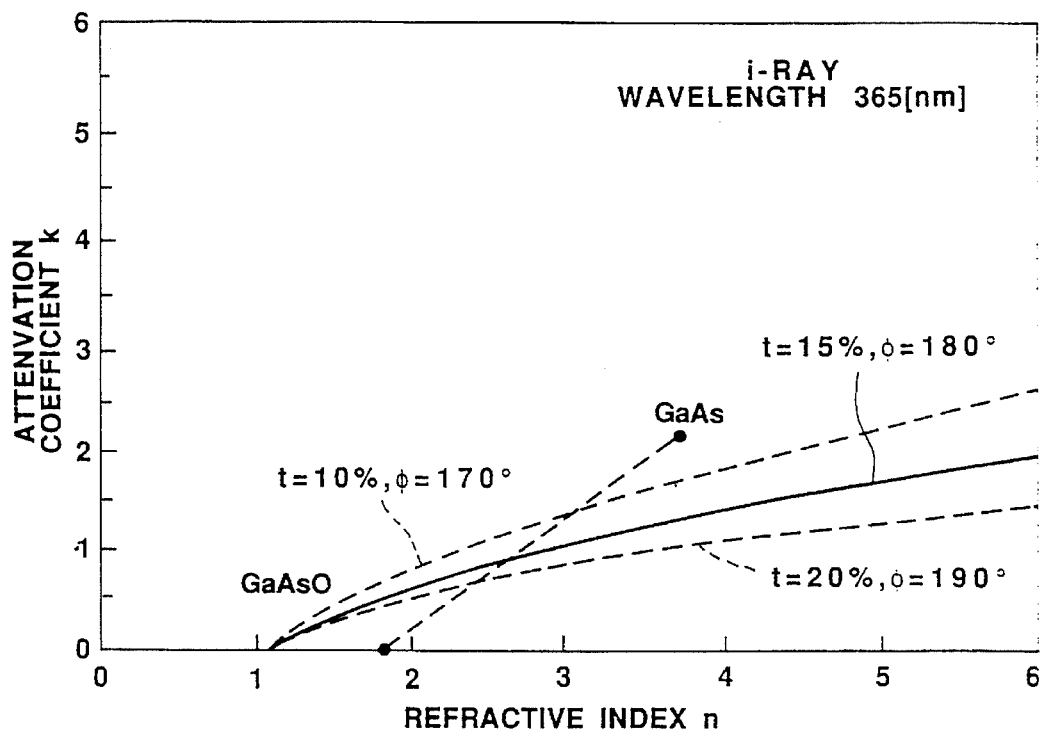
Figure 18B:
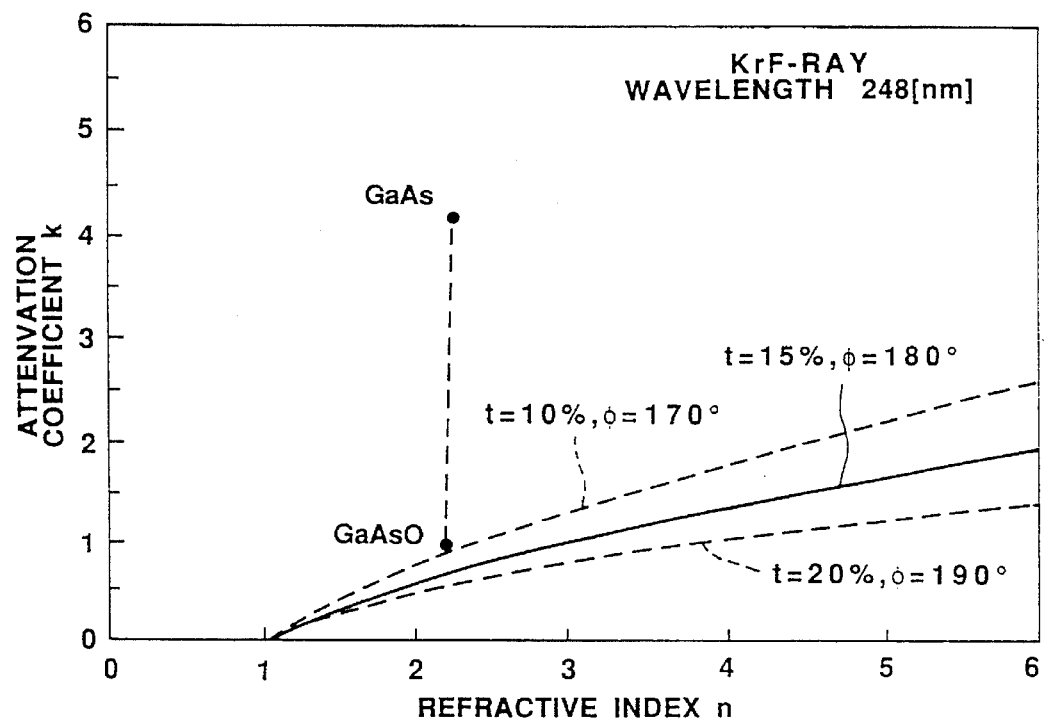
Figure 19:
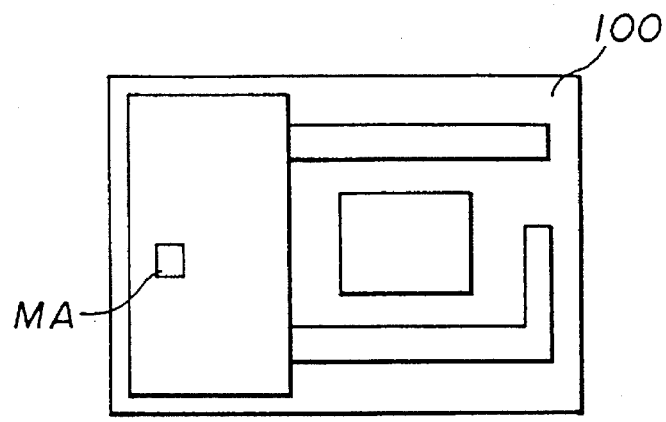
Figures 20A, 20B:
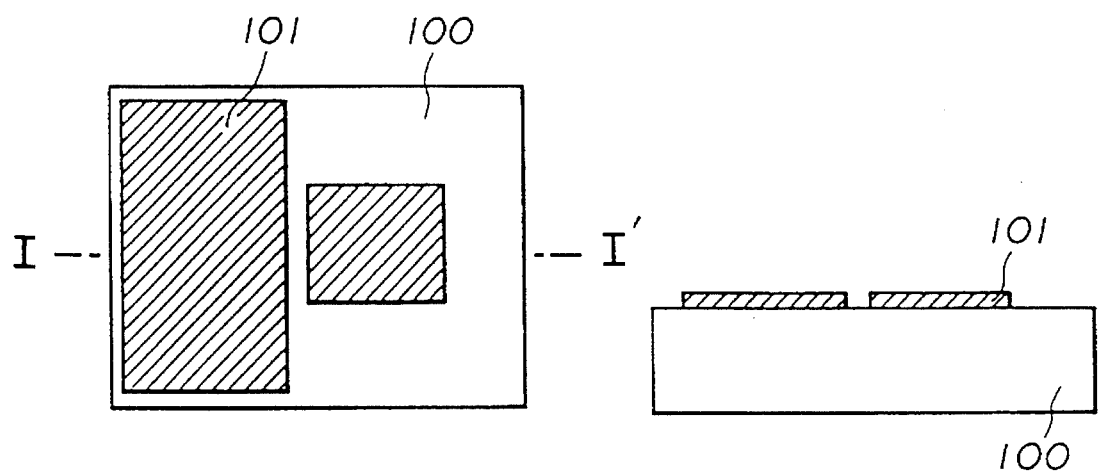
Figures 29A, 29B:
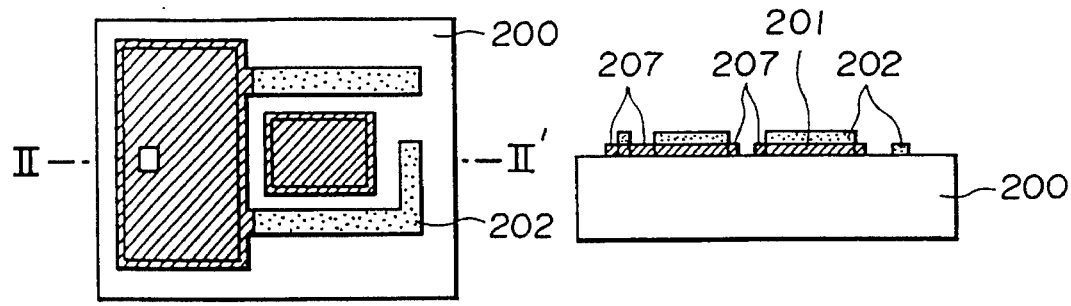
Figures 30A, 30B:
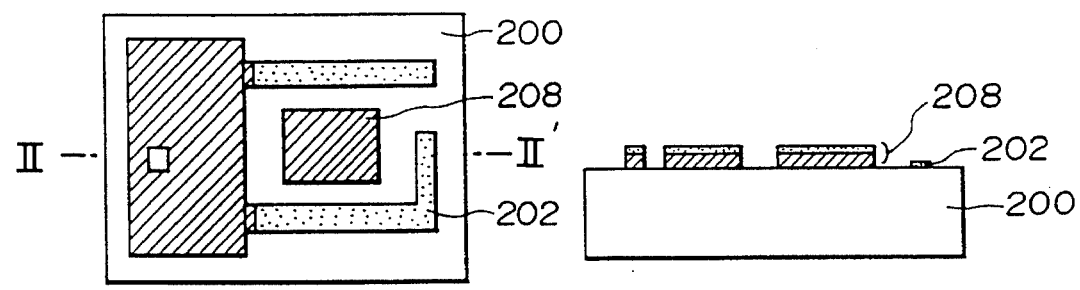
Figures 31A, 31B:
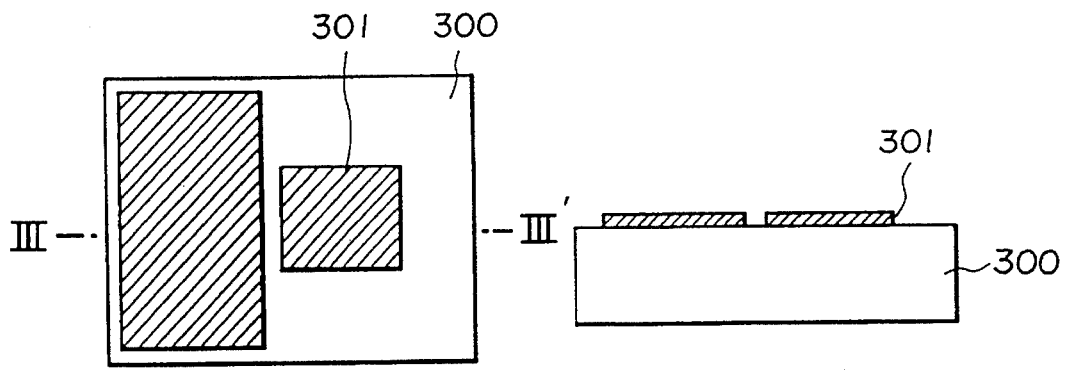
Figures 32A, 32B:
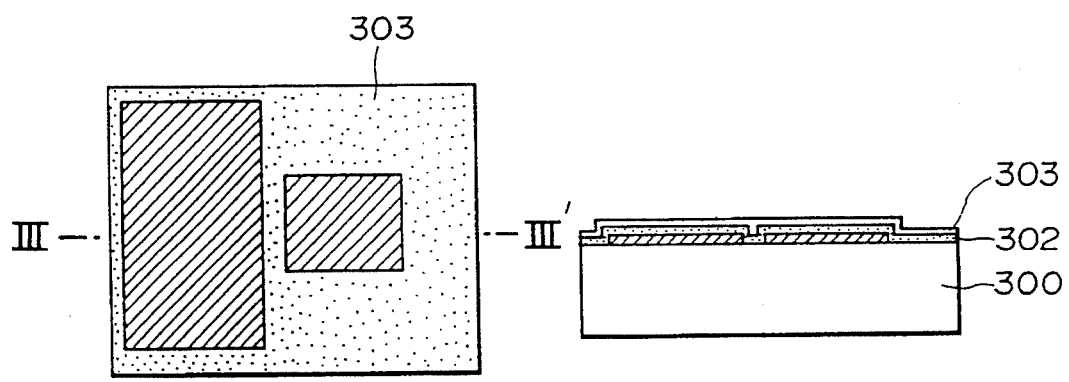
Figures 33A, 33B:
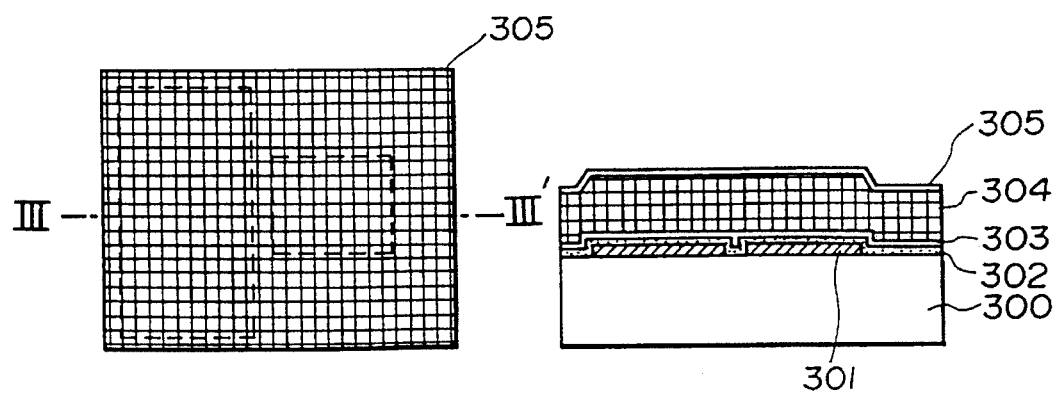
Figures 34A, 34B:
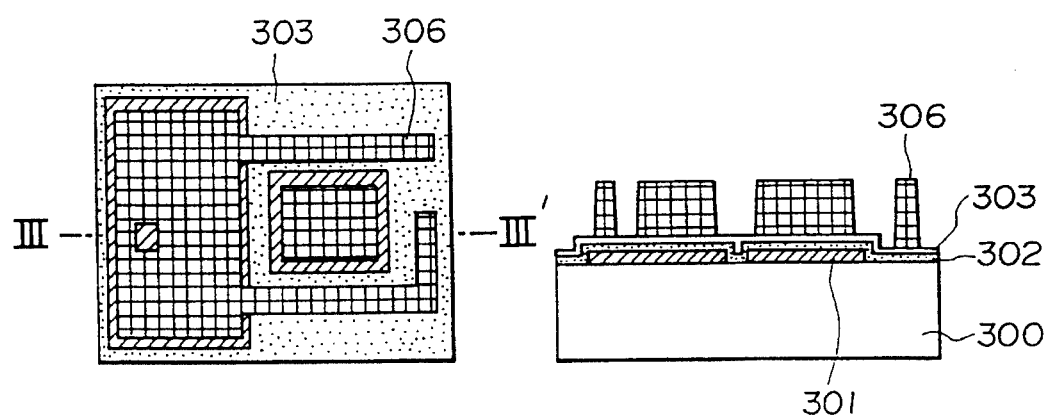
Figures 35A, 35B:
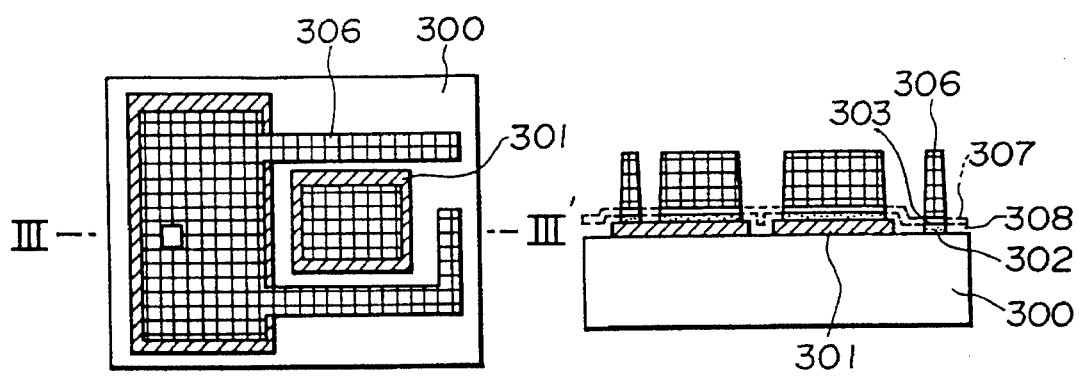
Figures 36A, 36B:
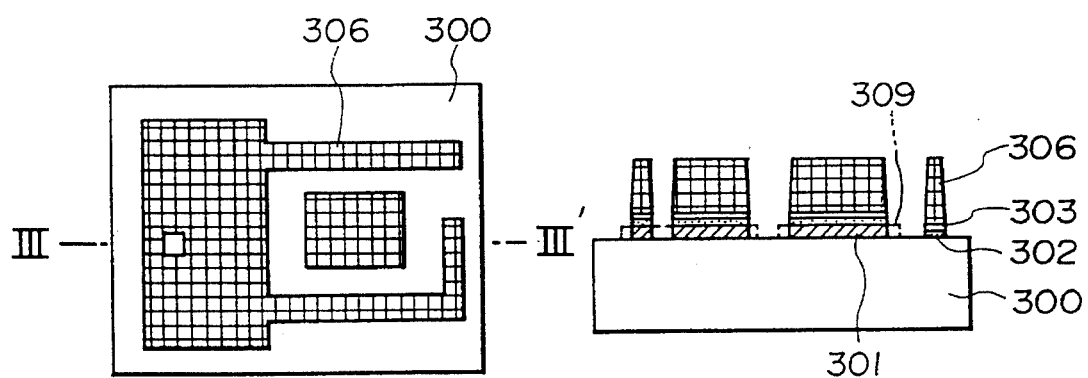
Figures 37A, 37B:
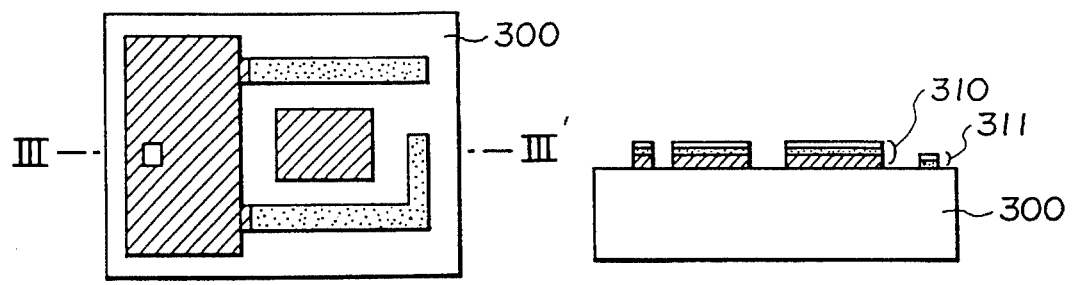
Figures 38A, 38B:
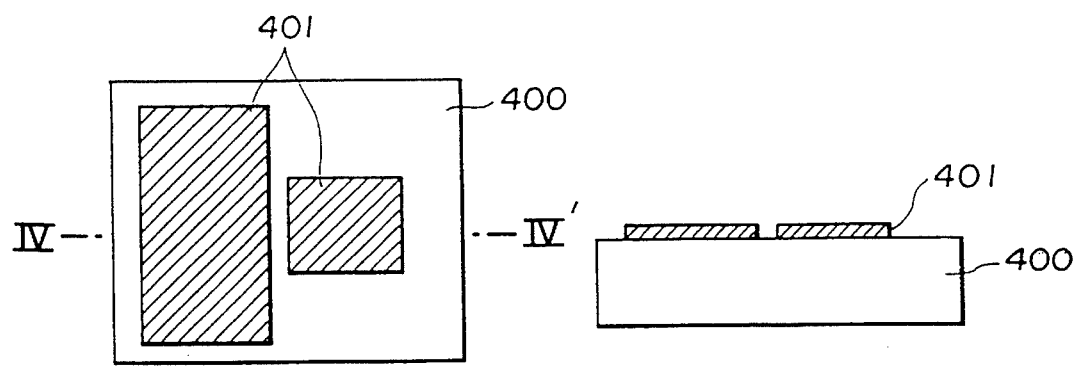
Figures 39A, 39B:
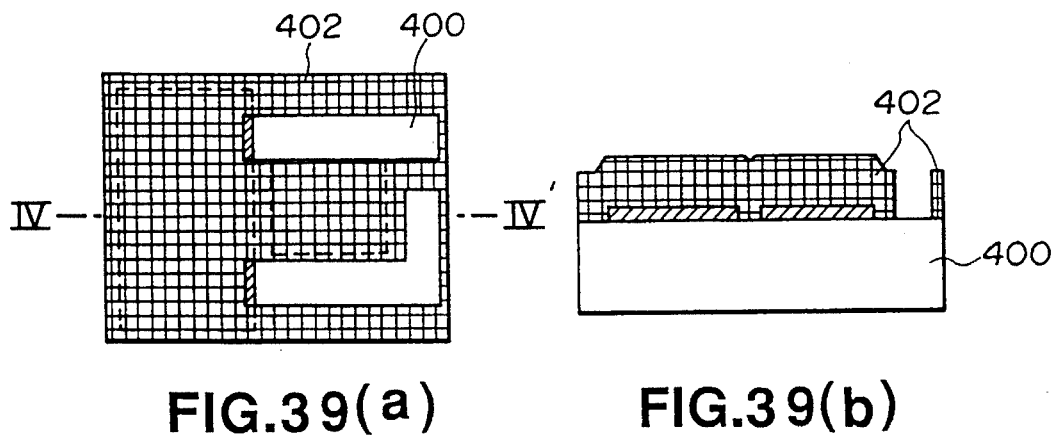
Figures 40A, 40B:
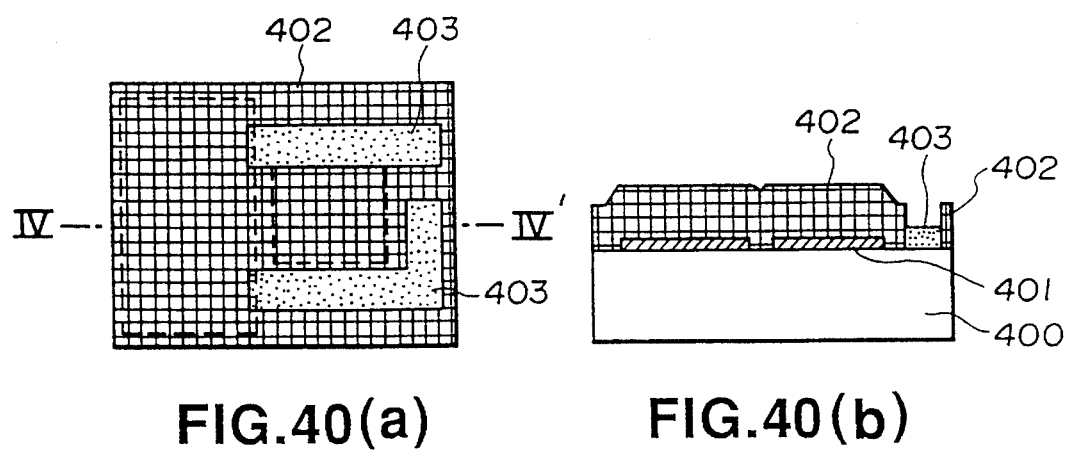
Figures 41, 41A:
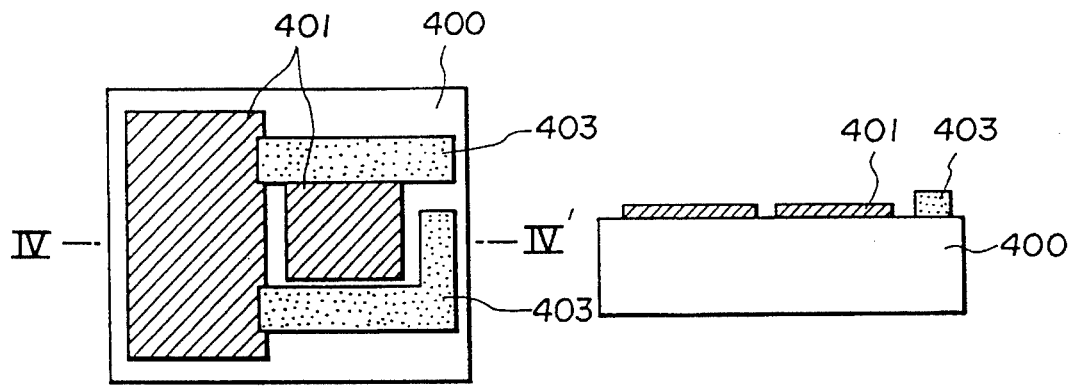

FIGS. (4a) and 4(b) show, in cross-sectional views, steps of a method for manufacturing an exposure mask in accordance with a sixth embodiment of the present invention;

FIGS. 5(a) to 5(c) show, in cross-sectional views, steps of a method for manufacturing an exposure mask substrate in accordance with a seventh embodiment of the present invention;

FIGS. 6(a) to 6(h) show, in cross-sectional views, steps of a method for manufacturing an exposure mask with use of the exposure mask substrate formed by the steps of the seventh embodiment of the present invention;

FIGS. 7(a) to 7(c) show, in cross-sectional views, steps of a method for manufacturing an exposure mask substrate in accordance with a ninth embodiment of the present invention;

FIGS. 8(a) to 8(h) show, in cross-sectional views, steps of a method for manufacturing an exposure mask with use of the exposure mask substrate formed by the steps of the ninth embodiment of the present invention;

FIGS. 9(a) to 9(c) show, in cross-sectional views, steps of a method for manufacturing an exposure mask substrate in accordance with a tenth embodiment of the present invention;

FIGS. 10(a) to 10(h) show, in cross-sectional views, steps of a method for manufacturing an exposure mask in accordance with a sixteenth embodiment of the present invention;

FIGS. 11(a) to 11(h) show, in cross-sectional views, steps of a method for manufacturing an exposure mask in accordance with a seventeenth embodiment of the present invention;

FIG. 12 is a characteristic diagram showing ranges of optical constants to be satisfied when a semi-transparent film pattern is made of a single layer film as well as actually measured values of the optical constants;

FIG. 13 is a characteristic diagram showing ranges of optical constants to be satisfied when a semi-transparent film pattern is made of a single layer film as well as actually measured values of the optical constants;

FIG. 14 is a characteristic diagram showing ranges of optical constants to be satisfied when a semi-transparent film pattern is made of a single layer film as well as actually measured values of the optical constants;

FIGS. 15(a) and 15(b) are characteristic diagrams showing a relationship between refractive index and attenuation coefficient for Cr-CrO$_2$;

FIGS. 16(a) and 16(b) are characteristic diagrams showing a relationship between refractive index and attenuation coefficient for Al-Al$_2$O$_3$;

FIGS. 17(a) and 17(b) are characteristic diagrams showing a relationship between refractive index and attenuation coefficient for Ti-TiO;

FIGS. 18(a) and 18(b) are characteristic diagrams showing a relationship between refractive index and attenuation coefficient for GaAs-GaAsO;

FIG. 19 is a desired mask pattern to be used in an eighteenth embodiment of the present invention;

FIGS. 20(a), 20(b), 21(a), 21(b), 22(a), 22(b), 23(a), 23(b), 24(a), 24(b), 25(a), 25(b), 26(a) and 26(b) show steps of a method for manufacturing an exposure mask described in the eighteenth embodiment;

FIGS. 27(a), 27(b), 28(a), 28(b), 29(a), 29(b), 30(a) and 30(b) show steps of a method for manufacturing an exposure mask described in a nineteenth embodiment;

FIGS. 31(a), 31(b), 32(a), 32(b), 33(a), 33(b), 34(a), 34(b), 35(a), 35(b), 36(a), 36(b), 37(a) and 37(b) show steps of a method for manufacturing an exposure mask described in a twentieth embodiment;

FIGS. 38(a), 38(b), 39(a), 39(b), 40(a), 40(b), 41(a), 41(b), 42(a), 42(b), 43(a), 43(b), 44(a) and 44(b) show steps of a method for manufacturing an exposure mask described in a twenty-first embodiment;

FIG. 45 is a cross-sectional view of a structure of an ideal half-tone phase shift film;

FIGS. 46(a) and 46(b) show a pattern other than a pattern area when exposure is carried out with use of a prior art half-tone phase shift film as well as an exposure state thereof; and FIG. 47 shows a state of the pattern area after exposure is carried out with use of the prior art half-tone phase shift film.

DESCRIPTION OF THE PREFERRED EMBODIMENTS

Prior to explanation of the embodiments, explanation will first be directed to the basic principle of the present invention.

When a semi-transparent film is made of a single layer, it is necessary to control the semi-transparent film in such a manner that the phase of light passed through the semi-transparent film is shifted by 180 degrees 10% with respect to the phase of light passed through transparent part, and it is also necessary to set the light transmissivity of the semi-transparent film at a desired value. The value ±0% means that, when the phase difference is changed by ±0 degrees from 180 degrees through simulation, the deterioration of a focal depth lies within its 10%.

In order to obtain a maximum resolution for the phase shift mask made of the semi-transparent film, it is necessary for the optical constants of the semi-transparent film to meet the following equations (1) and (2).

$$E1 = t1 \cdot E0 \tag{1}$$

$$E2 = t2 \cdot E0 \tag{2}$$

where E0 denotes a complex electric field vector for incident light, E1 denotes a complex electric field vector for light passed through a transparent region, E2 denotes a complex electric field vector for light passed through a semi-transparent region, and t1 and t2 denote amplitude transmissivities respectively.

For obtaining the maximum effects of the phase shift mask, relationships between the amplitude transmissivity ratio and phase difference of transmitted light must be satisfied as shown by the following equations (3) and (4).

$$0.1 \leq |E1|/|E2| < 0.4 \tag{3}$$

$$170 \text{ degrees} \leq |\delta1 - \delta2| \leq 190 \text{ degrees} \tag{4}$$

where, $$E1 = |E1| \exp(\delta1)$$

$$E2 = |E2| \exp(\delta2)$$

In the equations (1) and (2), the light amplitude transmissivities t1 and t2 for the semi-transparent and transparent regions can be easily found when multiple reflection for the materials of these regions having a thickness T is considered taking into account the reflectance, transmissivity and absorbance of the boundary between the region materials and other medium. The transmissivity and reflectance of a material can be found using a refractive index n and attenuation coefficient k. Further, the absorbance of the film can be found using the attenuation coefficient k.

Since the semi-transparent film in question is a phase shifter layer, the film thickness T is expressed using the refractive index n as follows, when consideration is directed to the fact that the semi-transparent film has a phase difference of 180 degrees with respect to an opening portion.

$$T = \lambda/2(n-1) \tag{5}$$

The transmissivity t is obtained as follows from the above variables as actually measured values.

$$t = F(n1, k1, n0, k0, T) \tag{6}$$

where n0 and k0 denote a refractive index and an attenuation coefficient which are inherent in a medium respectively. Thus, the amplitude transmissivity t can be uniquely found in accordance with the equation (6) with respect to the factors n1 and k1.

Based on the above consideration, when g ray light having a wavelength of, e.g., 436 nm is used for exposure and when the refractive index n is varied with a phase of 180±10 degrees and with an amplitude transmissivity of 15±5%, corresponding such attenuation coefficient k as shown by solid and broken curves in FIG. 12 can be obtained. In FIG. 12, ordinate denotes attenuation coefficient k, abscissa denotes refractive index n, a broken line (a) denotes a relationship between the attenuation coefficient k and refractive index n with an amplitude transmissivity of 10% and a phase of 170 degrees, a broken line (b) denotes a relationship between the attenuation coefficient k and refractive index n with an amplitude transmissivity of 20% and a phase of 190 degrees, and a solid line (c) denotes relationship between the attenuation coefficient k and refractive index n with an amplitude transmissivity of 15% and a phase of 180 degrees. A zone enclosed by the broken lines (a) and (b) corresponds to the allowable range. That is, so long as a point determined by the refractive index n and attenuation coefficient k of a material lies within the above allowable range, the material can have the function of the half-tone type phase shift film in the form of a single film.

In the case of the g-ray light, the materials of films satisfying the above conditions include, for example, amorphous Si indicated by a black dot in FIG. 12. When i-ray light having a wavelength of 365 nm is used for exposure, however, the amorphous Si (point of $N_2$ gas 0%) takes a value outside the allowable range as shown in FIG. 13. Thus, it will be appreciated that, in the case of the use of the i-ray exposure light, it is impossible to form a single-layer half-tone phase shift film with amorphous Si.

When the similar consideration is made as to $Si_3N_4$ (point of $N_2$ gas 80%), $Si_3N_4$ also takes a value out of the above allowable range. However, when two points of the amorphous Si and $Si_3N_4$ are connected by an arbitrary curve, it will be seen that the arbitrary curve necessarily can pass through the range enclosed by the broken lines. In other words, if there exists a substance having intermediate properties between the amorphous Si and $Si_3N_4$, then the substance can take a value within the allowable range. In the film formation of the substance, a reactive sputtering process with Si and $N_2$ can be used. In this case, by changing an $N_2$ reaction ratio, a film having arbitrary properties can be obtained. The values of the achieved substance are denoted by black dots. When a curve passing through the black dots is depicted, the curve can pass through the allowable range defined by the broken lines. The obtained optimum conditions are n=3.30 and k=1.19 when the flow rate of nitrogen gas is 15% during the sputtering operation. When the thickness S of the film is set to be 3.5 nm, an amplitude transmissivity ratio is 0.142 and a phase difference is 180 degrees. In this way, when an $Si_3N_4$ film is formed by changing the reaction ratio, a desired single-layer half-tone type phase shift film can be obtained.

Further, when exposure is carried out with a KrF excimer laser having a wavelength of 248 nm, it will be appreciated, as in the case of the use of the i-ray exposure light, that the property values of the amorphous Si and $Si_3N_4$ lie out of the allowable range but the value of a substance having properties intermediate between these materials can pass through the range as shown in FIG. 14.

The boundary conditions can also be set so that a phase is fixed to be 180 degrees to give some allowance to an amplitude transmissivity or an amplitude transmissivity is fixed to give some allowance to the phase. In addition, allowable values, when the influences and effects thereof on the resist process are taken into consideration, may be modified to be such values as mentioned herein.

As a result of our study of materials satisfying the aforementioned two conditions, it has been found that the aforementioned conditions can be met for substances made of one or a mixture of two or more selected from the group of silicon, silicon-contained mixture, germanium, germanium-contained compound and germanium-contained mixture; or for substances made of one or a mixture of two or more selected from the group of Cr, Al, Ti, Sn, In, Co or other metal element, metal compound, oxides, nitrides, hydrides, carbonides, and halides thereof. In particular, a silicon film and an SiN film can be semi-transparent films which are very valid for g-ray and i-ray regions, respectively. The characteristics of these substances are shown in Table 1.

TABLE 1

Amplitude Transmissivities of Films Formed As Final Substances Having Phase Difference Of 180 Degrees

| Material Name | Film Formation System | Exposure Wavelength (nm) | Film Thickness (%) with Phase Difference 180° | Amplitude Transmissivity (%) for $SiO_2$ |
|---|---|---|---|---|
| Si | Sputter (Target Si) | 436 | 59 | 17.4 |
| SiN | $N_2$ Flow Sputter (Target Si) | 365 | 80 | 15.0 |
| SiN | $N_2$ Flow Sputter (Target Si) | 248 | 76 | 15.0 |
| Ge | Sputter (Target Ge) | 436 | 70.3 | 10.8 |
| CrO | | 436 | 128 | 33.0 |
| CrO | | 365 | 130 | 26.1 |
| CrO | | 248 | 112 | 5.48 |
| GaAs | | 436 | 55 | 14.5 |
| GaAsO | | 248 | 103 | 7.07 |

When As, P or B ions are doped into the semi-transparent film, the quality of the resultant film can be somewhat adjusted, for example, its optical constants can be adjusted.

Further, when a silicon firm is heated to above 500° C., the amorphous state can be changed to polycrystalline state or continuously or discontinuously from the polycrystallines rate to single crystalline state to thereby obtain a desired property state.

The foregoing explanation has been made as to the basic conception of forming a single semi-transparent film. However, when it is desired to actually form a single semi-transparent film, some film sometimes finds difficulties in the composition ratio of the compound. For example, when it is desired to form an i-ray single-layer semi-transparent film through adjustment of the composition ratio of silicon to nitrogen, the silicon/nitrogen composition ratio satisfying the refractive index n and attenuation coefficient k for the optimum phase difference and transmissivity must be about 1:0.6. When compared to the composition ratio (silicon to nitrogen=1:1.33) of the $Si_3N_4$ film obtained usually through nitration of silicon, this ratio requires more finely adjustment of the flow rate of nitrogen because the nitrogen rate is much smaller than that of the $Si_3N_4$ case.

In this way, when such fine adjustment is required, it is desirable to form not the single-layer semi-transparent film but a multi-layer, semi-transparent film of 2 or more layers formed with different two composition ratios, for example, a multi-layer, film semi-transparent film of two layers formed of Si (silicon:nitrogen=1:0) and $Si_3N_4$ (silicon:nitrogen=1:1.33). In this case, the amount of sputtering $Si_3N_4$ molecule with respect to the unit sputtering amount of Si molecule is found to be 0.042. Under this condition, when the sputtering operations are carried out twice separately, there can be obtained a desired semi-transparent phase shift film equivalent to the multi-layer film. Further, when it is desired to form the KrF semi-transparent film with the separated formation of the $Si_3N_4$ as in the i-ray light, the silicon/nitrogen ratio must be 1:0.9 and therefore the sputtering amount of $Si_3N_4$ to the unit sputtering amount of Si molecule must be 0.74. When the sputtering operations are carried out under the above conditions, there can be obtained a desired semi-transparent phase shift film which is made of two sorts of semi-transparent layers of Si and $Si_3N_4$.

These films are formed with Si as the common element. The silicon is used as the target to form a silicon film by sputtering, and thereafter the silicon is sputtered with the nitrogen gas being introduced so as to deposit an $Si_3N_4$ film thereon. Since the material of the target is fixed to one sort during the sputtering process, the same apparatus can be used. Even when the resultant substrate is processed, the processing is only required for the common element Si and thus can be carried out only at one time through a reactive etching operation with a fluorine-series gas. When compared to the case of forming the semi-transparent phase shift film of two layers of two different elements Cr and $SiO_2$, steps relating to the film formation and processing can be simplified.

Further, the material of the semi-transparent film is not limited to Si and $Si_3N_4$, and any one can be selected from various sorts of materials. Shown in FIGS. 15 to 18 are relationships between the refractive index and attenuation coefficient with respect to various sorts of materials. More specifically, FIGS. 15(a) and 15(b) are for Cr-$CrO_2$, FIGS. 16(a) and 16(b) are for Al-$Al_2O_3$, FIGS. 17(a) and 17(b) are for Ti-TiO, and FIGS. 18(a) and 18(b) are for GaAs-GaAsO. In each of these drawings, an upper diagram is for i-ray (having a wave length of 365 nm) light while a lower diagram is for KrF-ray (having a wave length of 248 nm). The composition of each material is determined so as to lie with in a zone (allowable zone) enclosed by upper and lower broken lines in the respective drawings. The compositions obtained here can be applied not only to the case of the present invention but also to the formation of a single-layer semi-transparent film with the composition ratio controlled according to the reactive conditions.

When a material transition curve fails to pass through the allowable zone as when the material Ti-TiO is employed (FIG. 17(b)), it is considered that the half-tone phase shift film of the present invention cannot be formed. Further, when a final material is present in the boundary of the allowable zone as when the material Cr-CrO is employed (FIG. 15(a)), if the amplitude transmissivity ratio of 20% and the phase difference of 190 degrees can be regarded as with in the allowable range, then the final material can be used as it is.

EMBODIMENT 1

FIG. 1 shows, in cross-sectional views, steps of a method for manufacturing an exposure mask in accordance with a first embodiment of the present invention. The exposure mask is featured in that a semi-transparent film pattern is used which comprises a semi-transparent film of two layers of Si and $Si_3N_4$ formed through a sputtering process and this exposure mask is used as an i-ray mask.

Figure 1A:
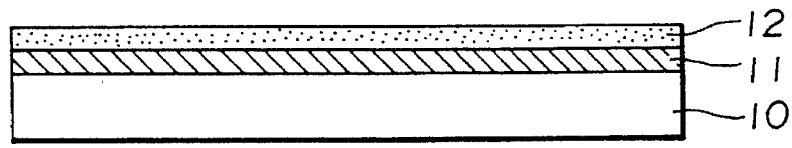
FIGS. 1(a) to 1(e) show, in cross-sectional views, steps of a method for manufacturing an exposure mask in accordance with a first embodiment of the present invention.

First, as shown in FIG. 1(a), a silicon oxide substrate 10 was subjected to sputtering process to form a silicon film 11 of 71 nm thick thereon. Subsequently, an $Si_3N_4$ film 12 of 19 nm was formed on the resultant substrate while a nitrogen gas was introduced into its furnace. At this time, a semi-transparent phase shift film of the two layers had a phase difference of 180 degrees with respect to the silicon oxide substrate 10 and an amplitude transmissivity of 22.4%.

Figure 1B:
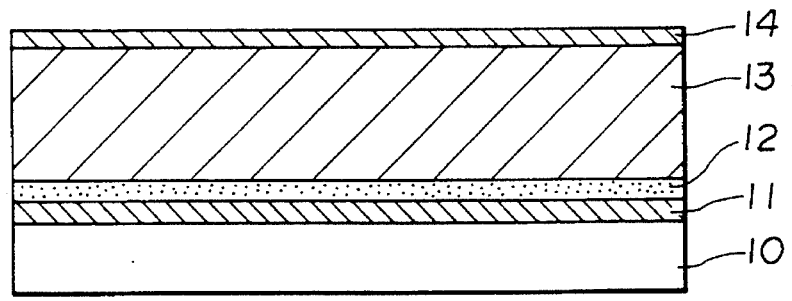

After this, as shown in FIG. 1(b), an electron beam resist film 13 of 0.5 μm thick was deposited on the $Si_3N_4$ film 12 and then an electrically conductive film 14 of about 0.2 μm thick was formed on the resist film 13.

Figure 1C:
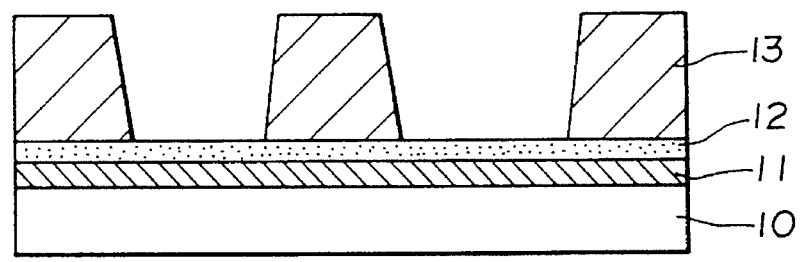

Next, as shown in FIG. 1(c), the resultant substrate was subjected to a pattern drawing operation by a pattern exposure system at 3 μC/cm$^2$ with use of an electron beam from above the conductive film 14, and then subjected to a developing process to form a pattern of the resist 13. The formation of the conductive film 14 is to prevent charge-up of the electron beam when the resist film 13 is an electrical insulator.

Figure 1D:
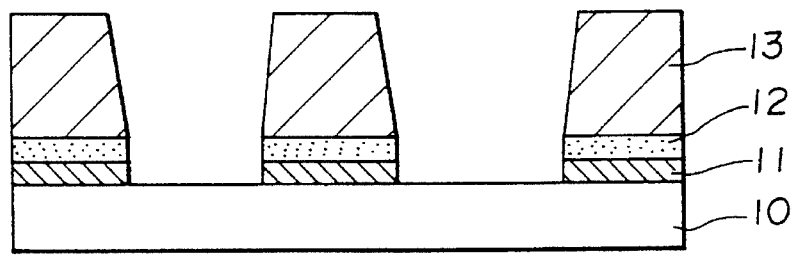
Figure 1E:
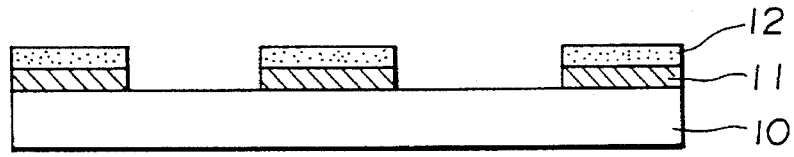

As shown in FIG. 1(d), the resultant substrate was subjected to a reactive ion etching process with use of a mixture gas of $CF_4$ and $O_2$ with the resist pattern used as a mask to sequentially remove the $Si_3N_4$ film 12 and silicon film 11 exposed from the resist pattern. And finally, the resist pattern was removed to obtain such a phase shifter made of the $Si_3N_4$ film 12 and silicon film 11 as shown in FIG. 1(e).

Although the formation of the silicon film and $Si_3N_4$ film has been made by means of the sputtering process in the present embodiment, it may be carried out by a chemical vapor deposition (CVD) process. Further, the processing of the silicon film and $Si_3N_4$ film may be carried out by a chemical dry etching (CDE) process of a wet etching process, as necessary.

Resist (known as a trade name PFR7750 and manufactured by Nippon Gousei Gomu K.K.) was coated on the thus-formed exposure mask to be 1.54 μm thick. The resultant substrate was then subjected to a ⅕ reduction exposure of g rays (NA=0.54, σ=0.5) to form a pattern. In this case, its exposure amount was 300 mJ/cm$^2$. A 0.45 μm pattern was resolved with a focus margin of 0 μm with use of a prior art mask, but could be resolved with a focus margin of 0.7 μm with use of the mask of the present invention.

With regard to a contact hole pattern, it has been confirmed that a 0.50 μm pattern could not be resolved in the prior art exposure process, but could be resolved with a focus margin of 1.5 μm with use of the mask of the present invention. Further, when a resist pattern transferred and formed with use of this mask is used as mask to process the substrate, a better processed shape can be obtained.

EMBODIMENT 2

Explanation will next be made as to a second embodiment of the present invention.

An exposure mask of the present embodiment is featured in that a semi-transparent film pattern is used which comprises a semi-transparent film of two layers of Si and $Si_3N_4$ formed through a sputtering process, and this exposure mask is used as a KrF mask. In the present embodiment, a silicon film 11 of 74 nm thick was formed on a silicon oxide substrate 10. Subsequently, an $Si_3N_4$ film 12 of 70 nm was formed on the resultant substrate during introduction of a nitrogen gas into its furnace. At this time, a semi-transparent phase shift film of the two layers had a phase difference of 180 degrees with respect to the silicon oxide substrate 10 and an amplitude transmissivity of 21.5%.

And, as in the first embodiment, an electron beam resist film 13 of 1.5 μm thick was deposited on the $Si_3N_4$ film 12 and then an electrically conductive film 14 of about 0.2 μm thick was formed on the resist film 13. Further, the resultant substrate was subjected to a pattern drawing operation by a pattern exposure system at β μC/cm$^2$ with use of an electron beam from above the conductive film 14, and then subjected to a developing process to form a resist pattern. The resultant substrate was subjected to a reactive ion etching process with a mixture gas of $CF_4$ and $O_2$ with the resist pattern used as a mask to sequentially remove the $Si_3N_4$ film 12 and silicon film 11 exposed from the resist pattern. And finally, the resist pattern was removed to obtain a phase shifter made of the $Si_3N_4$ film 12 and silicon film 11.

KrF resist (known as a trade name XP8843 and manufactured by Shipley K.K.) was coated on the thus-formed exposure mask to be 1.0 μm thick. The resultant substrate was then subjected to a ⅕ reduction exposure (NA=0.4, σ=0.5) of a KrF excimer laser to form a pattern. In this case, its exposure amount was 40 mJ/cm$^2$. A 0.30 μm pattern was resolved with a focus margin of 0 μm with use of a prior art mask, but could be resolved with a focus margin of 0.7 μm with use of the mask of the present invention. With regard to a contact hole pattern, it has been confirmed that a 0.30 μm pattern could not be resolved in the prior art exposure process, but could be resolved with a focus margin of 1.2 μm with use of the mask of the present invention.

Further, the formation of the silicon nitride film as the phase shifter was carried out by the sputtering process with the silicon used as a target while controlling the amount of nitrogen gas in the present embodiment, but, a sputtering process using a mosaic target of silicon and silicon nitride or a CVD process with the controlled gas ratio may be employed. Furthermore, the film thickness may be suitably set in such a range that does not depart from the gist of the present invention. Also an ion implantation process or a heat treatment may be carried out for fine adjustment of the refractive index and amplitude transmissivity so as to improve the quality of the surface of the film.

EMBODIMENT 3

A third embodiment of the present invention will then be explained.

The present embodiment directed to an i-ray is exposure mask prepared with use of Cr and $CrO_2$. When a single-layer semi-transparent CF film is formed by a reactive sputtering process, it has been confirmed that, when the flow rate of oxygen gas is adjusted so that an atmosphere has a oxygen/Cr element composition ratio of about 1.8, a desired semi-transparent phase shift film is obtained.

Next, when it is desired to form a semi-transparent film in the form of two Cr and $CrO_2$ layers, the resultant semi-transparent film can have a phase difference of 180 degrees and an amplitude transmissivity of 18% with respect to a silicon oxide substrate by setting a molecule composition ratio ($Cr:CrO_2$) to be 1:0.567.

Figure 2A:
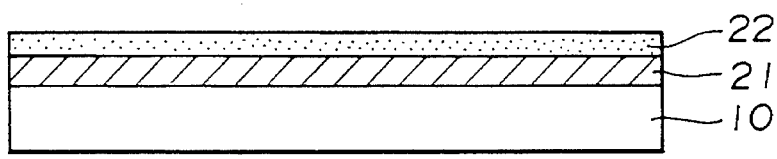
FIGS. 2(a) and 2(b) show, in cross-sectional views, steps of a method for manufacturing an exposure mask in accordance with a third embodiment of the present invention.

First, as shown in FIG. 2(a), a silicon oxide substrate 10 was subjected to a sputtering process to form a Cr film 21 of 70 nm thick thereon. Subsequently, a $CrO_2$ film of 42 nm thick was formed on the resultant substrate while an oxygen gas is introduced into its furnace.

As in the first embodiment, an electron beam resist film of 1.0 μm thick was formed on the resultant substrate, the substrate was subjected to a pattern drawing operation of a pattern exposure system at 6 μC/cm$^2$, and then subjected to a developing process to form a resist pattern.

Figure 2B:
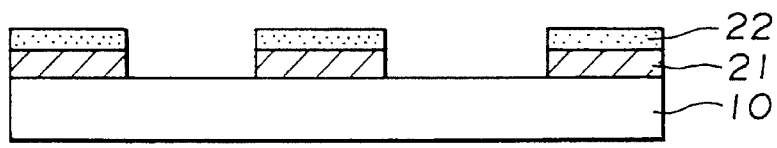

The resultant substrate was subjected to a reactive ion etching process with use of a mixture gas of $Cl_2$ and $O_2$ with the resist pattern used as a mask to sequentially remove the $CrO_2$ film 22 and the Cr film 21 exposed from the resist pattern. And final the resist pattern is removed to obtain such a phase shifter made of the Cr film 21 and $CrO_2$ film 22 as shown in FIG. 2(b).

In the present embodiment, when a desired amplitude transmissivity is about 26%, a phase shifter made of only the $CrO_2$ film can also be obtained by using the $CrO_2$ film as a single layer and controlling the thickness of the $CrO_2$ film to be 130 nm.

The substrate having an i-ray resist (known as a trade name PFRIX500 and manufactured by Nippon Gousei Gomu K.K.) of 1.3 μm thick coated thereon was subjected to a ⅕ reduction exposure (NA=0.5. σ=0.6) with i-ray light of a mercury lamp through the projection exposure mask prepared according to the present embodiment to form a pattern. In this case, the amount of exposure was 300 mJ/cm$^2$. With regard to a line and space pattern, a 0.35 μm pattern was resolved with a focus margin of 0 μm in the prior art exposure, whereas the pattern could be resolved with a focus margin of 0.9 μm with use of the mask of the present invention.

Even with respect to a contact hole pattern, it has been confirmed that a 0.40 μm pattern, which could not be resolved in the prior art exposure, can be resolved with a focus margin of 1.5 μm. The pattern of the mask is transferred onto the resist layer formed on the substrate and then the substrate is selectively etched away with use of the transferred pattern as a resist pattern, whereby a favorably processed shape can be obtained.

In the present embodiment, the formation of a $CrO_x$ shifter film may be carried out by a CVD process with the controlled composition ratio of an atmosphere gas. Further, in the present embodiment, the etching of the Cr and $CrO_2$ films may be carried out by a chemical dry etching (CDE) process or a wet etching process (using an ammonium cerium nitrate solution).

EMBODIMENT 4

A fourth embodiment of the present invention will next be explained.

The present embodiment is directed to an i-ray exposure mask prepared with use of Al and $Al_2O_3$. When a single-layer semi-transparent Al film is formed by a reactive sputtering process, it has been confirmed that, when the flow rate of oxygen gas is adjusted so that an atmosphere has a oxygen/Al element composition ratio of about 1.40, a desired semi-transparent phase shift film is obtained.

Next, when it is desired to form a semi-transparent film in the form of two Al and $Al_2O_3$ layers, the resultant semi-transparent film can have a phase difference of 180 degrees and an amplitude transmissivity of 15% with respect to a silicon oxide substrate by setting a molecule composition ratio ($Al:Al_2O_3$) to be 1:18.3.

Figure 3A:
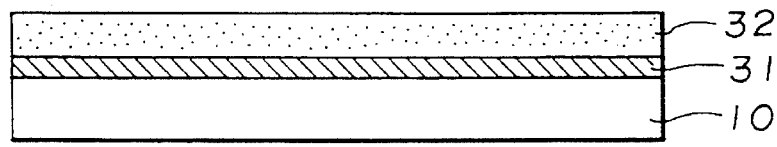
FIGS. 3(a) and 3(b) show, in cross-sectional views, steps of a method for manufacturing an exposure mask in accordance with a fourth embodiment of the present invent ion.

First, as shown in FIG. 3(a), a silicon oxide substrate 10 was subjected to a sputtering process to form an Al film 31 of 23 nm thick thereon. Subsequently, a $Al_2O_3$ film 32 of 248 nm thick was formed on the resultant substrate while an oxygen gas is introduced into its furnace.

As in the first embodiment, an electron beam resist film of 1.0 μm thick was formed on the resultant substrate, the substrate was subjected to a pattern drawing operation of a pattern exposure system at 6 μC/cm$^2$, and then subjected to a developing process to form a resist pattern.

Figure 3B:
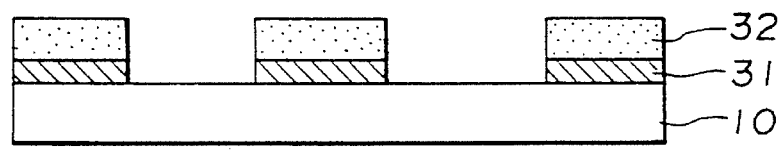

The resultant substrate was subjected to a reactive ion etching process with use of a mixture gas of $Cl_2$ and $O_2$ with the resist pattern used as a mask to sequentially remove the $Al_2O_3$ and Al films exposed from the resist pattern. And finally, the resist pattern is removed to obtain such a phase shifter made of the Al film 31 and $Al_2O_3$ film 32 as shown in FIG. 3(b).

The substrate having an i-ray resist (known as a trade name PFRIX500 and manufactured by Nippon Gousei Gomu K.K.) of 1.3 μm thick coated thereon was subjected to a ⅕ reduction exposure (NA=0.5, σ=0.6) with i-ray light of a mercury lamp through the projection exposure mask prepared according to the present embodiment to form a pattern. In this case, the amount of exposure was 300 mJ/cm$^2$.

With regard to a line and space pattern, a 0.35 μm pattern was resolved with focus margin of 0 μm in the prior art exposure, whereas the pattern could be resolved with a focus margin of 0.9 μm with use of the mask of the present invention. Even with respect to a contact hole pattern, it has been confirmed that a 0.40 μm pattern, which could not be resolved in the prior art exposure, can be resolved with a focus margin of 1.5 μm. The pattern of the mask is transferred onto the resist layer formed on the substrate and then the substrate is selectively etched away with use of the transferred pattern as a resist pattern, whereby a favorably processed shape can be obtained.

EMBODIMENT 5

A fifth embodiment of the present invention will then be explained.

The present embodiment is directed to a KrF-ray exposure mask prepared with use of Al and $Al_2O_3$. When a single-layer semi-transparent Al film is formed by a reactive sputtering process, it has been confirmed that, when the flow rate of oxygen gas is adjusted so that an atmosphere has an oxygen/Al element composition ratio of about 1.43, a desired semi-transparent phase shift film is obtained.

When it is desired to form a semi-transparent film in the form of two Al and $Al_2O_3$ layers, the resultant semi-transparent film can have a phase difference of 180 degrees and an amplitude transmissivity of 15% with respect to a silicon oxide substrate by setting a molecule composition ratio ($Al:Al_2O_3$) to be 1:10.

First, a silicon oxide substrate 10 was subjected to a sputtering process to form an Al film 31 of 14 nm thick thereon. Subsequently, a $Al_2O_3$ film 32 of 161 nm thick was formed on the resultant substrate while an oxygen gas is introduced into its furnace. Next, an electron beam resist film of 1.0 μm thick was formed on the resultant substrate, the substrate was subjected to a pattern drawing operation of a pattern exposure system at 6 μC/cm², and then subjected to a developing process to form a resist pattern.

The resultant substrate was subjected to a reactive ion etching process with use of a mixture gas of $Cl_2$ and $O_2$ with the resist pattern used as a mask to sequentially remove the $Al_2O_3$ and Al films 32 and 31 exposed from the resist pattern. And final the resist pattern is removed to obtain such a phase shifter made of the Al film 31 and $Al_2O_3$ film 32.

The substrate having an i-ray resist (known as a trade name XP8843 and manufactured by Shipley K.K.) of 1.0 μm thick coated thereon was subjected to a ⅕ reduction exposure (NA=0.4, σ=0.5) of a KrF excimer laser with i-ray light of a mercury lamp through the projection exposure mask prepared according to the present embodiment to form a pattern. In this case, the amount of exposure was 40 mJ/cm². A 0.30 μm pattern was resolved with a focus margin of 0 μm in the prior art exposure, whereas the pattern could be resolved with a focus margin of 0.7 μm with use of the mask of the present embodiment.

Even with respect to a contact hole pattern, it has been confirmed that a 0.30 μm pattern, which could not be resolved in the prior art exposure, can be resolved with a focus margin of 1.2 μm.

EMBODIMENT 6

Explanation will then be made as to a sixth embodiment of the present invention.

The present embodiment is directed to an i-ray exposure mask prepared with use of Ti and $TiO_2$. When a single-layer semi-transparent Ti film is formed by a reactive sputtering process, it has been confirmed that, when the flow rate of oxygen gas is adjusted so that an atmosphere has an oxygen/Ti element composition ratio of about 0.61, a desired semi-transparent phase shift film is obtained.

When it is desired to form a semi-transparent film in the form of two Ti and $TiO_2$ layers, the resultant semi-transparent film can have a phase difference of 180 degrees and an amplitude transmissivity of 15.4% with respect to a silicon oxide substrate by setting a molecule composition ratio (Ti:$TiO_2$) to be 1:0.43.

Figure 4A:
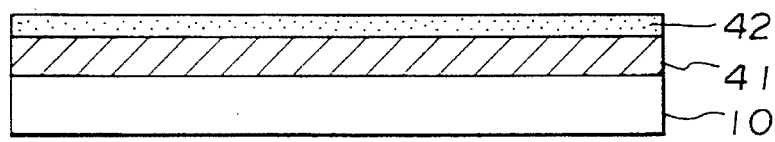

First, as shown in FIG. 4(a), a silicon oxide substrate 10 was subjected to a sputtering process to form a Ti film 41 of 196 nm thick thereon. Subsequently, a $TiO_2$ film 42 of 84 nm thick was formed on the resultant substrate while an oxygen gas is introduced into its furnace.

Next, an electron beam resist film of 1.0 μm thick was formed on the resultant substrate, the substrate was subjected to a pattern drawing operation of a pattern exposure system at 6 μC/cm², and then subjected to a developing process to form a resist pattern. The resultant substrate was subjected to a reactive ion etching process with use of a fluorine-series gas with the resist pattern used as a mask to sequentially remove the $TiO_2$ film 42 and Ti film 41 exposed from the resist pattern.

Figure 4B:
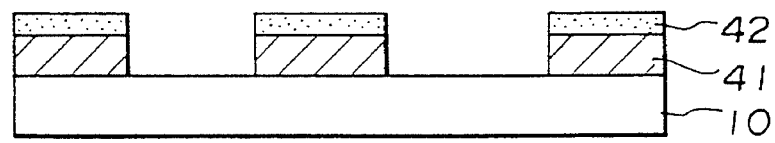

And finally, the resist pattern is removed to obtain such a phase shifter made of the Ti film 41 and $TiO_2$ film 42 as shown in FIG. 4(b).

The substrate having an i-ray resist (known as a trade name PFRIX500 and manufactured by Nippon Gousei Gomu K.K.) of 1.3 μm thick coated thereon was subjected to a ⅕ reduction exposure (NA=0.5, σ=0.6) with i-ray light of a mercury lamp through the projection exposure mask prepared according to the present embodiment to form a pattern. In this case, the amount of exposure was 300 mJ/cm².

With regard to a line and space pattern, a 0.35 μm pattern was resolved with a focus margin of 0 μm in the prior art exposure, whereas the pattern could be resolved with a focus margin of 0.9 μm with use of the mask of the present invention. Even with respect to a contact hole pattern, it has been confirmed that a 0.40 μm pattern, which could not be resolved in the prior art exposure, can be resolved with a focus margin of 1.5 μm. Further, when the resultant substrate is subjected to a transferring process with use of this mask and then subjected to a processing operation with the formed resist pattern used as a mask, a favorably processed shape can be obtained.

The present invention is not limited to the foregoing embodiments. For example, in each of the foregoing embodiments, the material of the first semi-transparent film may be replaced by the material of the second semi-transparent film. Further, two sorts of semi-transparent film layers are used in the respective embodiments, more than two sorts of semi-transparent film layers may be employed as necessary. In addition, a plurality of identical semi-transparent films (each made of two or more sorts of layers) may be stacked. In this way, the present invention may be modified in various ways without departing from the subject matter of the present invention.

EMBODIMENT 7

FIG. 5 shows, in cross-sectional views, steps of a method for manufacturing an exposure mask substrate in accordance with a seventh embodiment of the present invention. The exposure mask substrate is used for preparation of a g-ray phase shift mask. A light transmissive substrate 60 is subjected to a sputtering process to form an amorphous silicon film 51 thereon as a semi-transparent film, subjected to a surface oxidization process to form a silicon oxide substrate 62 thereon, and further subjected to a sputtering process to form a second amorphous silicon film 63 on the resultant substrate with use of a silicon target.

More in detail as shown in FIG. 5(a), a quartz substrate 60 of 2.5 mm thick was first subjected to a sputtering process to form an amorphous silicon film 61 of 59 nm thick thereon. The amorphous silicon film 61 had a refractive index n of 4.93 and an amplitude transmissivity of 17.4% with respect to the quartz substrate.

Subsequently, as shown in FIG. 5(b), the resultant substrate was subjected to an oxidization process in a plasma atmosphere containing oxygen atoms to form a silicon oxide film 62 on the amorphous silicon film 61.

Further, as shown in FIG. 5(c), the resultant substrate was subjected to a sputtering process with use of a silicon target to deposit a second amorphous silicon film 63 of 59 nm thick thereon. The 2-layer film thus obtained including the silicon oxide film had an amplitude transmissivity of 3.0%. In this way, an exposure mask substrate is obtained. The thickness of the amorphous silicon film as the second semi-transparent film is set so that the overall amplitude transmissivity of the entire semi-transparent film also including the first amorphous silicon film and the silicon oxide film is 5.0% or less.

Next, how to form an exposure mask with use of this exposure mask substrate will be explained.

Figure 6A:
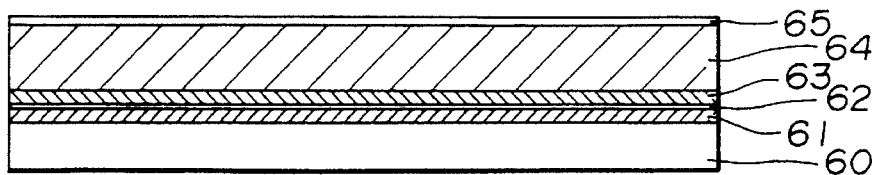

First, as shown in FIG. 6(a), an electron beam resist film 64 of 500 nm thick is formed on the exposure mask substrate obtained through the above steps of FIGS. 5(a) to 5(c), and then an electrically conductive film 65 of 200 nm thick is coated on the film 64.

Figure 6B:
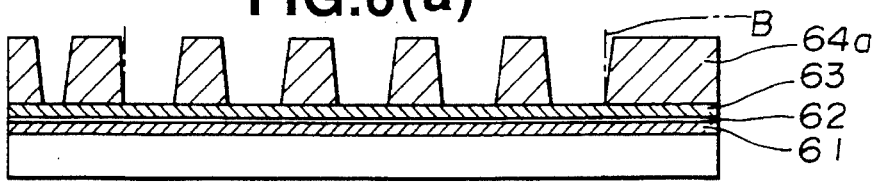

Next, as shown in FIG. 6(b), the resultant substrate was subjected to a pattern drawing operation of a pattern exposure system with use of an electron beam based on data about a device pattern and zones other than the device pattern, and then subjected to a developing process to form a resist pattern 64a. Even in this case, the substrate was subjected to the pattern drawing operation from above the electrically conductive film 65 with use of the electron beam and then subjected to the developing process to form the resist pattern 64a. The formation of the electrically conductive coated film 65 was to prevent charge-up of the electron beam when the resist 64 is an electrically insulating material. In the drawing, symbol B denotes a boundary between the pattern zone and non-pattern zone.

Figure 6C:
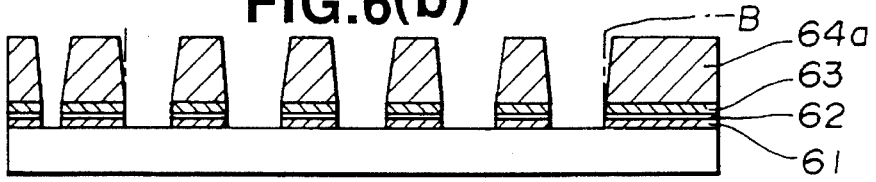

As shown in FIG. 6(c), the resultant substrate was subjected to a reactive ion etching process with use of a $CF_4$ gas and with the resist pattern used as a mask to remove the second amorphous silicon film 68 exposed from the resist pattern, subjected to a reactive ion etching process with use of a mixture gas of $CF_4$ and $O_2$ to etch the silicon oxide film 62, and further subjected to a reactive ion etching process with use of the $CF_4$ gas to remove the first amorphous silicon film 61.

Figure 6D:
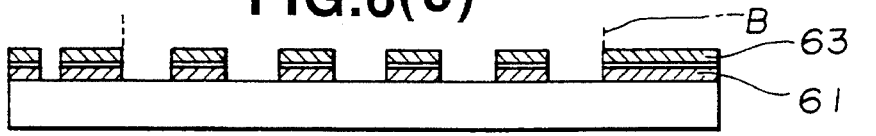

Thereafter, as shown in FIG. 6(d), the resist pattern 64a was removed.

Figure 6E:
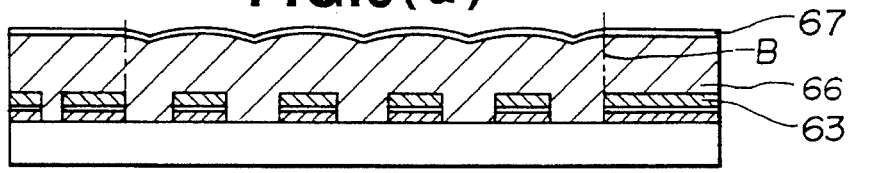

In this way, such a phase shift pattern comprising the first and second amorphous silicon layers as shown in FIG. 6(e) was obtained. Then an electron beam resist film 66 of 500 nm thick was formed on the substrate and an electrically conductive film 67 of 200 nm thick was coated thereon.

Figure 6F:
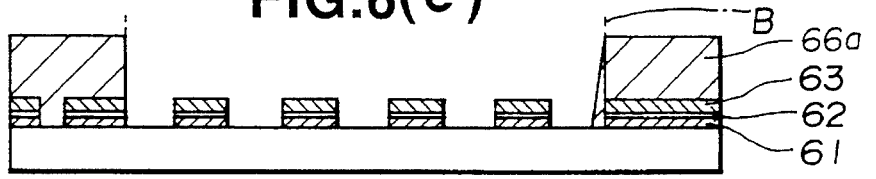

Next, as shown in FIG. 6(f), the resultant substrate was subjected to a pattern drawing operation of a pattern exposure system with use of an electron beam based on the data prepared so that the resist film remains in the non-device pattern zones, and then subjected to a developing process to thereby form a resist pattern 66a. Even in this case, the pattern drawing was carried out from above the electrically conductive coated film 67 with use of the electron beam and then the developing operation was carried out to form the resist pattern 66a.

Figure 6G:
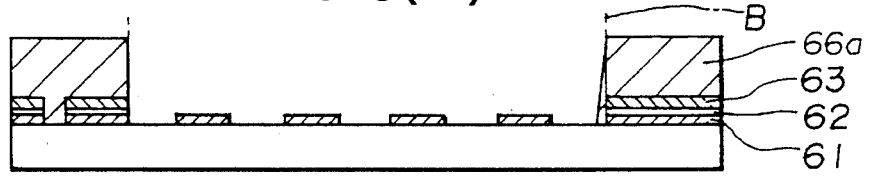

Subsequently, as shown in FIG. 6(g), the resultant substrate was subjected to a reactive ion etching process with use of the $CF_4$ and with use of the resist pattern as a mask to remove the second amorphous silicon film 63 within the pattern zone with the silicon oxide film 62 used as an etching stopper, and then subjected to an etching process to remove the silicon oxide film 62.

Figure 6H:
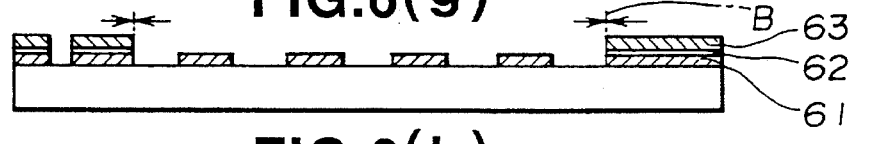

Finally, as shown in FIG. 6(h), the resist pattern was removed.

The exposure mask thus formed has a semi-transparent film of only the first amorphous silicon film which has an amplitude transmissivity of 17.4% in the device pattern zone, and also has a light shielding film which has an amplitude transmissivity of 3% in the zone other than the device pattern zone.

Accordingly, since at least that area of the non-device pattern zone where light reaches the wafer through the transfer acts to shield the exposure light, even when exposure is carried out a plurality of times, too narrowed pattern or insufficient focal depth can be prevented.

EMBODIMENT 8

Explanation has been made as to the g-ray exposure mask in the foregoing embodiment. In the present embodiment, an i-ray exposure mask will be explained.

First of all, an i-ray exposure mask substrate is formed.

As in the embodiment 7 shown in FIGS. 5(a) to (c), a quartz substrate of 2.5 mm thick was subjected to a sputtering process with use of a silicon target in a nitrogen atmosphere to form a first silicon nitride film $SiN_\beta$ ($0.6 \leq \beta \leq 0.8$) of 80 nm thick thereon. The silicon nitride film has a refractive index n of 3.40 and an amplitude transmissivity of 15.1% with respect to the quartz substrate.

Subsequently, the resultant substrate was oxidized in a plasma atmosphere containing oxygen atoms to form a silicon oxide film on the silicon nitride film.

The resultant substrate was subjected to a sputtering process with use of the silicon target to form a second silicon nitride film $SiN_\beta$ of 80 nm thick ($0.6 \leq \beta \leq 0.8$) on the silicon oxide film. A two-layer film thus obtained including the silicon oxide film had an amplitude transmissivity of 2.2%.

In this connection, the second silicon nitride film may be replaced by a silicon film. Further, the thickness of the second silicon nitride film or silicon film may be set to be arbitrary so long as the two-layer film has an amplitude transmissivity of 5% or less.

Next, an exposure mask is formed with use of the obtained exposure mask substrate.

First, as in the steps shown in FIGS. 6(a) to 6(h), an electron beam resist film of 500 nm thick was formed on the exposure mask substrate obtained through the above steps, and then an electrically conductive film 65 of 200 nm thick was coated thereon.

Next, the resultant substrate was subjected to a pattern drawing operation of a pattern exposure system with use of an electron beam based on data about a device pattern and zones other than the device pattern, and then subjected to a developing process to form a resist pattern. Even in this case, the substrate was subjected to the pattern drawing operation from above the electrically conductive film with use of the electron beam and then subjected to the developing process to form the resist pattern.

Next, the resultant substrate was subjected to a reactive ion etching process with use of a mixture gas of $CF_4+O_2+N_2$ and with the resist pattern used as a mask to remove the second silicon nitride film exposed from the resist pattern, subjected to a reactive ion etching process with use of a mixture gas of $CF_4$ and $O_2$ to etch the silicon oxide film, and further subjected to a reactive ion etching process with use of the mixture gas of $CF_4+O_2+N_2$ to remove the first silicon nitride film and also the resist pattern.

In this way, a 2-layer phase shift pattern comprising the first and second silicon nitride film layers was obtained. Then an electron beam resist film of 500 nm thick was formed on the substrate and an electrically conductive film of 200 nm thick was coated thereon.

Next, the resultant substrate was subjected to a pattern drawing operation of a pattern exposure system with use of an electron beam based on the data prepared so that the resist film remains in the non-device pattern zones, and then subjected to a developing process to thereby form a resist pattern.

Subsequently, the resultant substrate was subjected to a reactive ion etching process with use of the mixture gas of $CF_4+O_2+N_2$ and of the resist pattern as a mask to remove the second silicon nitride film within the pattern zone with the silicon oxide film used as an etching stopper, and then subjected to an etching process to remove the silicon oxide film.

Finally, the resist pattern was removed.

The exposure mask thus formed has a semi-transparent film of only the first silicon nitride film which has an amplitude transmissivity of 15.1% in the device pattern zone, and also has a light shielding film which has an amplitude transmissivity of 2.2% in the zones other than the device pattern zone.

Even in this case, as in the embodiment 7, since at least that area of the non-device pattern zone where light reaches the wafer through the transfer acts to shield the exposure light, even when exposure is carried out a plurality of times, too narrowed pattern or insufficient focal depth can be prevented.

EMBODIMENT 9

FIG. 7 shows, in cross-sectional views, steps of a method for manufacturing an exposure mask substrate in accordance with a ninth embodiment of the present invention. The exposure mask substrate is used for preparation of an i-ray phase shift mask. A light transmissive substrate 70 is subjected to a sputtering process to form a Cr film 71 thereon as a semi-transparent film, a coated glass layer 72 is formed on the Cr film 71, and the resultant substrate is further subjected to a sputtering process to form a Cr film 73 on the resultant substrate with use of a Cr target.

More in detail, as shown in FIG. 7(a), a quartz substrate 70 of 2.5 mm thick was first subjected to a sputtering process to form a first Cr film 71 of 35 nm thick thereon. The first Cr film 71 had a refractive index n of 1.98 and an amplitude transmissivity of 20.2% with respect to the quartz substrate.

Subsequently, as shown in FIG. 7(b). A coated glass film 72 of 329 nm thick was formed on the Cr film 71. In this cases, the phase difference was set to be 180 degrees, taking the respective phase differences of the Cr and coated glass films into consideration.

Further, as shown in FIG. 7(c), the resultant substrate was subjected to a sputtering process with use of a Cr target to deposit a second Cr film 73 of 35 nm thereon. The 2-layer film thus obtained including the coated glass film had an amplitude transmissivity of 4.0%.

Next, a method of forming an exposure mask with use of this exposure mask substrate will be explained.

Figure 8A:
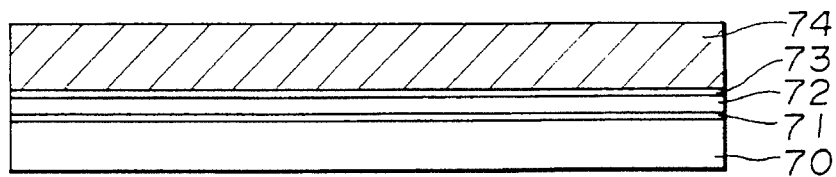

First, as shown in FIG. 8(a), an electron beam resist film 74 of 500 nm thick is formed on the exposure mask substrate obtained through the above steps of FIGS. 7(a) to 7(c).

Figure 8B:

Next, as shown in FIG. 8(b), the resultant substrate was subjected to a pattern drawing operation of a pattern exposure system with use of an electron beam based on data about a device pattern and zones other than the device pattern, and then subjected to a developing process to form a resist pattern 74a. In the drawing, symbol B denotes a boundary between the pattern zone and non-pattern zone.

Figure 8C:
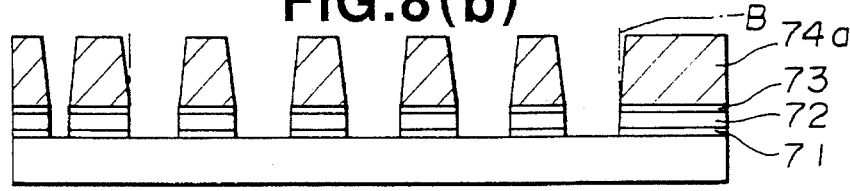

As shown in FIG. 8(c), the resultant substrate was subjected to a reactive ion etching process with use of a $CCl_4$ gas and with the resist pattern used as a mask to remove the second Cr film 73 exposed from the resist pattern, subjected to a reactive ion etching process with use of a mixture gas of $CF_4$ and $O_2$ to etch the glass film 72, and further subjected to a reactive ion etching process with use of the $CCl_4$ gas to remove the first Cr film 71.

Figure 8D:
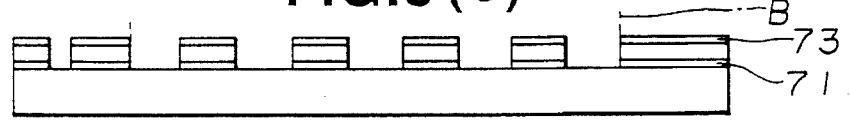
Figure 8E:
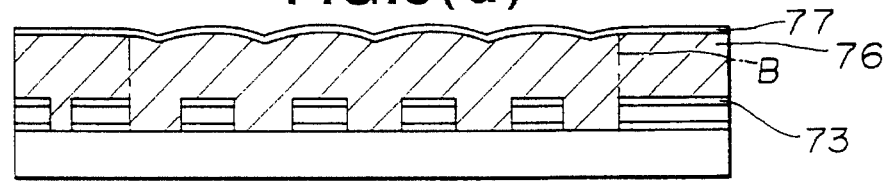

Thereafter, as shown in FIG. 8(d), the resist pattern was removed.

In this way, such a 2-layer phase shift pattern comprising the first and second Cr layers was obtained. Then an electron beam resist film 76 of 500 nm thick was formed on the substrate, as shown in FIG. 8(c).

Figure 8F:
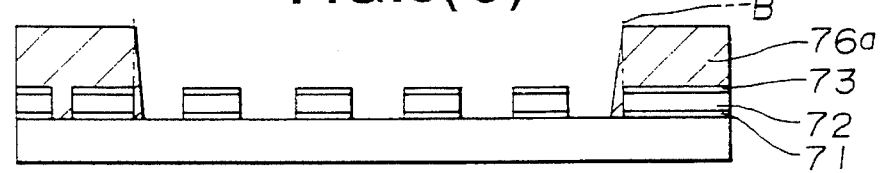

Next, as shown in FIG. 8(f), the resultant substrate was subjected to a pattern drawing operation of a pattern exposure system with use of an electron beam based on the data prepared so that the resist film remains in the non-device pattern zones, and then subjected to a developing process to thereby form a resist pattern 76a.

Figure 8G:
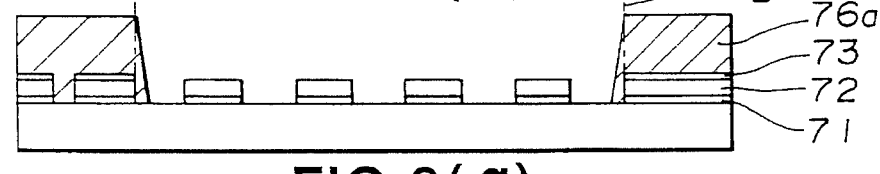

Subsequently, as shown in FIG. 8(g), the resultant substrate was subjected to reactive ion etching process with use of the $CCl_4$ gas and with use of the resist pattern as a mask to remove the second Cr film 73 within the pattern zone with the coated glass film 72 used as an etching stopper.

Figure 8H:
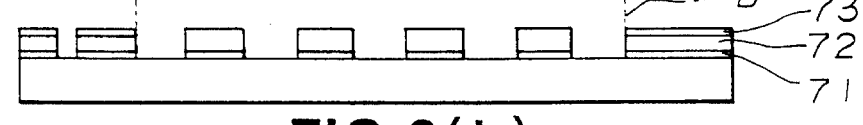

Finally, as shown in FIG. 8(h), the resist pattern was removed.

The exposure mask thus formed has a semi-transparent film of only the first Cr film which has an amplitude transmissivity of 20.2% in the device pattern zone, and also has a light shielding film which has an amplitude transmissivity of 4% in the zone other than the device pattern zone.

Accordingly, since at least that area of the non-device pattern zone where light reaches the wafer through the transfer acts to shield the exposure light, even when exposure is carried out a plurality of times, too narrowed pattern or insufficient focal depth can be prevented.

EMBODIMENT 10

Explanation will then be made as to another exposure mask substrate in accordance with a tenth embodiment of the present invention.

The present embodiment is directed to an exposure mask substrate in which a light shielding film can be formed out of a pattern region. FIG. 9 shows, In cross-sectional views, steps of a method for manufacturing the exposure mask substrate in accordance with the tenth embodiment of the present invention. The exposure mask substrate, which is used for formation of an i-ray phase shift mask, is featured in that a silicon nitride film $SiN_{0.6}$ 81 as a semi-transparent film for formation of a phase shifter is formed on a light transmissive substrate 80, a Cr film 82 as a light shielding film is formed on the silicon nitride film 81, and a CrO film 83 as an anti-reflective film is coated on the Cr film 82.

More specifically, as shown in FIG. 9(a), a silicon oxide substrate 80 of 2.5 mm thick was subjected to a reactive sputtering process in a nitrogen atmosphere with use of a silicon target to deposit thereon a uniform silicon nitride film $SiN_{0.6}$ 81 of 75 nm thick with 0.6 mol of nitrogen to one mol of Si. The silicon nitride film $SiN_{0.6}$ is designed so that the film has a light phase of 254 degrees there in with respect to i-ray light from a mercury lamp and is delayed by a phase of 180 degrees with respect to a light phase 74 degrees which travels through an air layer of 75 nm thick. The silicon nitride film $SiN_{0.6}$ 81 had an amplitude transmissivity of 3% with respect to the i-ray light.

Subsequently, as shown in FIG. 9(b), the resultant substrate was subjected to a sputtering process to form the Cr film 82 of 75 nm thick as a light shielding film on the silicon nitride film $SiN_{0.6}$ 81.

Further, as shown in FIG. 9(c), the resultant substrate was subjected to a sputtering process in an oxygen atmosphere with a Cr target to deposit the CrO film 83 of 30 nm thick as an anti-reflective film.

Next, in substantially the same manner as the foregoing example and with use of this exposure mask substrate, an exposure mask was formed.

EMBODIMENT 11

Explanation will then be made as to another exposure mask substrate in accordance with an eleventh embodiment of the present invention.

Even the present embodiment is directed to an exposure mask substrate in which a light shielding film can be formed out of a pattern region. The exposure mask substrate, which is used for formation of a phase shift mask for a KrF excimer laser, is featured in that a silicon nitride film $SiN_{0.9}$ as a semi-transparent film for formation of a phase shifter is formed on a silicon oxide substrate of 2.5 mm thick, a Cr film as a light shielding film is formed on the silicon nitride film, and a CrO film as an anti-reflective film is coated on the Cr film.

More specifically, a silicon oxide substrate of 2.5 mm thick was subjected to a reactive sputtering process in a nitrogen atmosphere with use of a silicon target to deposit thereon a uniform silicon nitride film $SiN_{0.9}$ of 80 nm thick with 0.9 mol of nitrogen to one mol of Si. The silicon nitride film $SiN_{0.9}$ is designed so that the film has a light phase of 296 degrees therein with respect to 248 nm light issued from the KrF excimer laser and is delayed by a phase of 180 degrees with respect to the light traveling through an air layer of 80 nm thick and having a light phase of 116 degrees. The silicon nitride film $SiN_{0.9}$ had an amplitude transmissivity of 4% with respect to the 248 nm light of the KrF excimer laser.

Subsequently, the resultant substrate was subjected to a sputtering process to form the Cr film of 79 nm thick as a light shielding film on the silicon nitride film $SiN_{0.9}$.

Further, the resultant substrate was subjected to a sputtering process in an oxygen atmosphere with a Cr target to deposit the CrO film of 30 nm thick as an anti-reflective layer.

Even when an electrically conductive film SnO is disposed between the $SiN_{0.9}$ and Cr films and other structure is substantially the same as that of the foregoing embodiment 11, substantially the same results can be obtained.

EMBODIMENT 12

Explanation will next be made as to another exposure mask substrate in accordance with a twelfth embodiment of the present invention.

Even the present embodiment is directed to an exposure mask substrate in which a light shielding film can be formed out of a pattern region. The exposure mask substrate, which is used for formation of a phase shift mask for a KrF excimer laser, is featured in that a silicon nitride film $SiN_{1.0}$ as a semi-transparent film for formation of a phase shifter is formed on a silicon oxide substrate of 2.5 mm thick, a Cr film as a light shielding film is formed on the silicon nitride film, and a CrO film as an anti-reflective layer is coated on the Cr film.

More specifically, the silicon oxide substrate of 2.5 mm thick was subjected to a reactive sputtering process in a nitrogen atmosphere with use of a silicon target to deposit thereon a uniform silicon nitride film $SiN_{1.0}$ of 94 nm thick with one mol of nitrogen to one mol of Si. The silicon nitride film $SiN_{1.0}$ is designed so that the film has a light phase of 355 degrees therein with respect to 248 nm light issued from the KrF excimer laser and is delayed by a phase of 180 degrees with respect to the light traveling through an air layer of 94 nm thick and having a light phase of 175 degrees. The silicon nitride film $SiN_{1.0}$ had an amplitude transmissivity of 4% with respect to the 248 nm light of the KrF excimer laser.

Subsequently, the resultant substrate was subjected to a sputtering process to form the Cr film of 70 nm thick as a light shielding film on the silicon nitride film $SiN_{1.0}$.

Further, the resultant substrate was subjected to a sputtering process in an oxygen atmosphere with a Cr target to deposit the CoO film of 30 nm thick as an anti-reflective film.

EMBODIMENT 13

Explanation will next be made as to another exposure mask substrate in accordance with a thirteenth embodiment of the present invention.

Even the present embodiment is directed to an exposure mask substrate in which a light shield film can be formed out of a pattern region. The exposure mask substrate, which is used for formation of a phase shift mask for i-ray light issued from a mercury lamp, is featured in that a silicon nitride film $SiN_{0.6}$ as a semi-transparent film for formation of a phase shifter is formed on a silicon oxide substrate of 2.5 mm thick, an SnO film of 10 nm thick as an electrically conductive film is deposited on the silicon nitride film $SiN_{0.6}$, a Cr film is formed as a light shielding film on the SiO film, and a CrO film as an anti-reflective layer is coated on the Cr film.

More specifically, a silicon oxide substrate of 2.5 mm thick was subjected to a reactive sputtering process in a nitrogen atmosphere with use of a silicon target to deposit thereon a uniform silicon nitride film $SiN_{0.6}$ of 75 nm thick with 0.6 mol of nitrogen to one mol of Si. The silicon nitride film $SiN_{0.6}$ is designed so that the film has a light phase of 254 degrees therein with respect to the i-ray light and is delayed by a phase of 180 degrees with respect to the light traveling through an air layer of 75 nm thick and having a light phase of 74 degrees. The silicon nitride film $SiN_{0.6}$ had an amplitude transmissivity of 3% with respect to the i-ray light.

Subsequently, the resultant substrate was subjected to a sputtering process to form an SnO film of 10 nm thick as an electrically conductive film on the silicon nitride film $SiN_{0.6}$.

Further, the resultant substrate was subjected to a sputtering process in an oxygen atmosphere with a Cr target to deposit a CrO film of 30 nm thick as an anti-reflective film.

Even when an electrically conductive film SnO is directly formed on a light transmissive substrate, a silicon nitride film is formed on the SnO film, and other structure is set to be substantially the same as that of the foregoing embodiment 12, substantially the same results can be obtained.

EMBODIMENT 14

Explanation will next be made as to another exposure mask substrate in accordance with a fourteenth embodiment of the present invention.

Even the present embodiment is directed to an exposure mask substrate in which a light shielding film can be formed out of a pattern region. The exposure mask substrate, which is used for formation of a phase shift mask for 248 nm light issued from a KrF excimer laser, is featured in that a silicon nitride film $SiN_{0.9}$ of 80 nm thick as a semi-transparent film for formation of a phase shifter is formed on a silicon oxide substrate of 2.5 mm thick, an SnO film of 10 nm thick as an electrically conductive film is deposited on the silicon nitride film, a Cr film as a light shielding film is formed on the SnO film, and a CrO film as an anti-reflective layer is coated on the Cr film.

More specifically, a silicon oxide substrate of 2.5 mm thick was subjected to a reactive sputtering process in a nitrogen atmosphere with use of a silicon target to deposit thereon a uniform silicon nitride film $SiN_{0.9}$ of 80 nm thick with 0.9 mol of nitrogen to one mol of Si. The silicon nitride film $SiN_{0.9}$ is designed so that the film has a light phase of 296 degrees therein with respect to 248 nm light issued from the KrF excimer laser and is delayed by a phase of 180 degrees with respect to the light traveling through an air layer of 80 nm thick and having a light phase of 116 degrees. The silicon nitride film $SiN_{0.9}$ had an amplitude transmissivity of 4% with respect to the 248 nm light of the KrF excimer laser.

Subsequently, the resultant substrate was subjected to a sputtering process to deposit an SnO film of 8 nm thick as an electrically conductive film on the silicon nitride film $SiN_{0.9}$, and further subjected to a sputtering process to form a Cr film of 70 nm thick as a light shielding film on the SnO film.

Further, the resultant substrate was subjected to a sputtering process in an oxygen atmosphere with a Cr target to deposit a CrO film of 30 nm thick as an anti-reflective film on the Cr film.

EMBODIMENT 15

Explanation will then be made as to another exposure mask substrate in accordance with fifteenth embodiment of the present invention.

Even the present embodiment is directed to an exposure mask substrate in which a light shielding film can be formed out of a pattern region. The exposure mask substrate, which is used for formation of a phase shift mask for i-ray light issued from a mercury lamp, is featured in that an SnO film of 10 nm thick as an electrically conductive film is deposited on a silicon oxide substrate of 2.5 nm thick, a two-layer film comprising a silicon oxide film $SiO_2$ and a silicon film is formed as a semiconductor film which is to be a phase shifter, a Cr film as a light shielding film is formed on the two-layer film, and a CrO film as an anti-reflective layer is coated on the Cr film.

More specifically, a icon oxide substrate of 2.5 mm thick was subjected to a reactive sputtering process to deposit thereon an SnO film of 10 nm thick, subjected, to a chemical vapor deposition (CVD) process to form a silicon oxide film of 150 nm on the SnO film, and then subjected to a sputtering process to from a silicon film of 37 nm thick thereon. The two-layer film is designed so that the film has a light phase of 364 degrees therein with respect to the i-ray light passed therethrough and is delayed by a phase of 180 degrees with respect to the light traveling through an air layer of 187 nm thick and having a light phase of 184 degrees. The two-layer film had an amplitude transmissivity of 2.5% with respect to the i-ray light.

Subsequently, the resultant substrate was subjected to a sputtering process to form an Cr film of 70 nm thick as a light shielding film on the two-layer film.

Further, the resultant substrate was subjected to a sputtering process in an oxygen atmosphere with a Cr target to deposit a CrO film of 30 nm thick as an anti-reflective film.

Though an electrically conductive film SnO was directly formed on the light transmissive substrate, it may be formed on the two-layer film.

EMBODIMENT 16

An exposure mask will be formed in substantially the same manner as the foregoing embodiment with use of the exposure mask substrate. In the present embodiment, the exposure mask substrate prepared in the foregoing embodiment 11 is employed. This exposure mask substrate, which is used for formation of a phase shift mask for a KrF excimer laser, has such a structure that a silicon nitride film $SiN_{0.9}$ 91 as a semi-transparent film for formation of a phase shifter is formed on a silicon oxide substrate 90 of 2.5 mm thick, a Cr film 92 as a light shielding film is formed on the film 91, and a CrO film 93 as an anti-reflective layer is coated on the film 92.

Figure 10A:
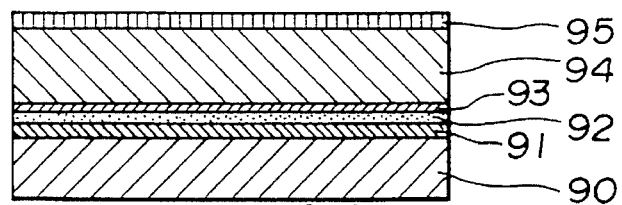

More in detail, as shown in FIG. 10(a), an electron beam resist film 94 of 500 nm thick was formed on a exposure mask substrate, and further an electrically conductive film 95 of 200 nm thick is coated thereon.

Figure 10B:
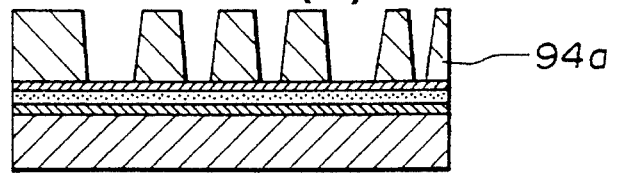

Subsequently, as shown in FIG. 10(b), the resultant substrate was subjected to a pattern drawing operation of a pattern exposure system at 4 $\mu C/cm^2$ with use of an electron beam based on data about a device pattern and zones other than the device pattern, and then subjected to a developing process to form a resist pattern 94a. Even in this case, the substrate was subjected to the pattern drawing operation from above the electrically conductive coated film 95 with use of the electron beam and then subjected to the developing process to form the resist pattern 94a. In the drawing, symbol B denotes a boundary between the pattern zone and non-pattern zone.

Figure 10C:
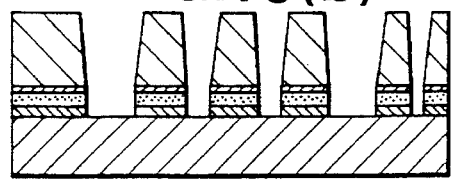

As shown in FIG. 10(c), the resultant substrate was next subjected to a reactive ion etching process with use of a $Cl_2$ gas and with the resist pattern used as a mask to remove the CrO and Cr films exposed from the resist pattern, subjected to reactive ion etching process with use of a mixture gas of $CF_4$ and $O_2$ to etch and remove the exposed silicon oxide film $SiN_{0.9}$ 91.

Figure 10D:
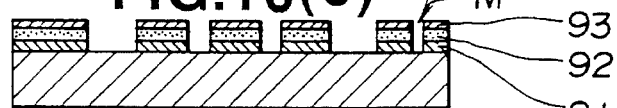

Thereafter, as shown in FIG. 10(d), the resist pattern was removed with a mixture aqueous solution of sulfuric acid and hydrogen peroxide. As a result, a phase shift pattern comprising the light shielding film and the semi-transparent film is formed. At the same time, an alignment mark M is formed for the purpose of exposure for removal of an unnecessary light shielding film.

Figure 10E:
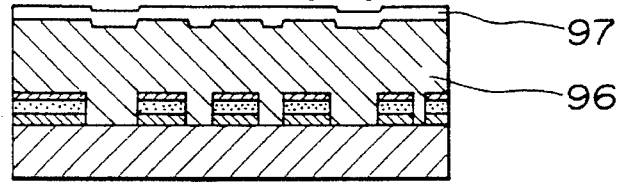

In this way, such a phase shift pattern comprising the light shielding and semi-transparent layers as shown in FIG. 10(e) was obtained. Then an electron beam resist film 96 of 500 nm thick was formed on the substrate and an electrically conductive film 97 of 200 nm thick was coated thereon.

Figure 10F:
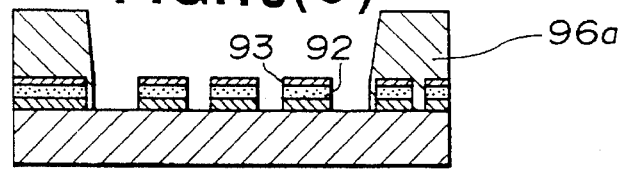

Next, as shown in FIG. 10(f), the resultant substrate was subjected to a pattern drawing operation of a pattern exposure system at 4 $\mu C/cm^2$ with use of an electron beam based on the data prepared so that the resist film remains in the non-device pattern zones, and then subjected to a developing process to thereby form a resist pattern 96a. Even in this case, the pattern drawing was carried out from above the electrically conductive film 97 with use of the electron beam and then the developing operation was carried out to form the resist pattern 96a.

Figure 10G:
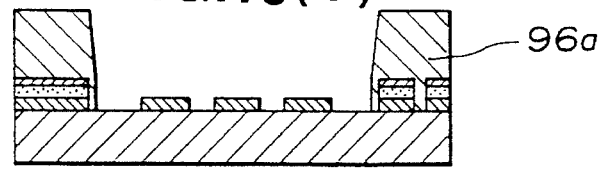

Subsequently, as shown in FIG. 10(g), the resultant substrate was subjected to a reactive ion etching process with use of the $Cl_2$ and of the resist pattern as a mask to remove the CrO film 93 and Cr film 92.

Figure 10H:
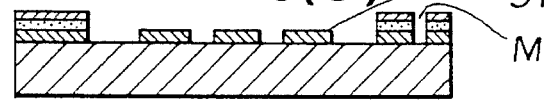
Figure 11A:
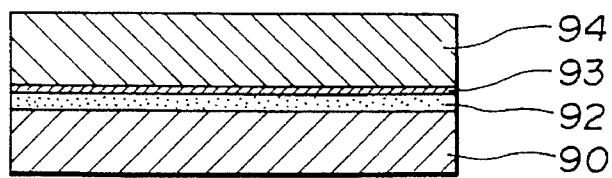
Figure 11B:
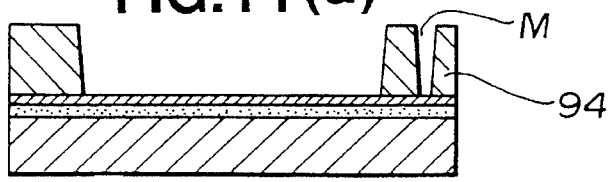
Figure 11C:
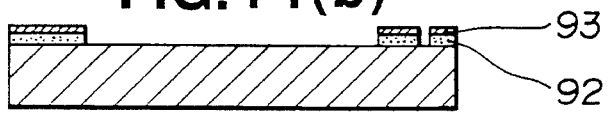
Figure 11D:
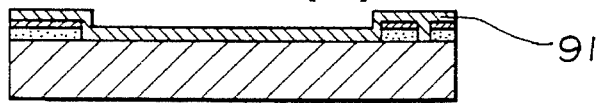
Figure 11E:
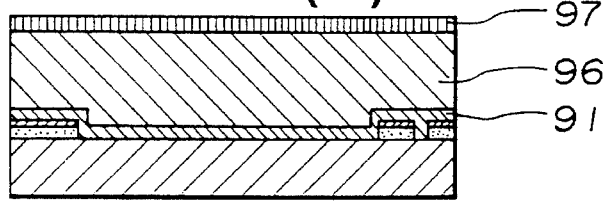
Figure 11F:
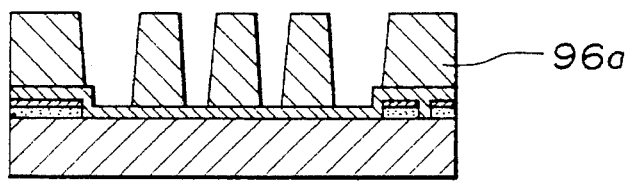
Figure 11G:
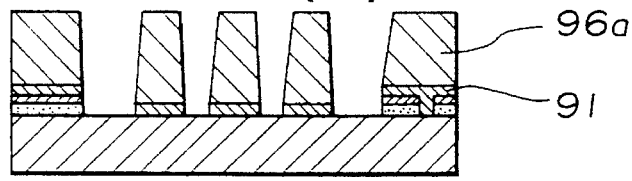
Figure 11H:
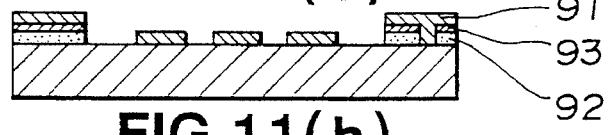

Finally, as shown in FIG. 10(h), the resist pattern was removed with a mixture aqueous solution of sulfuric acid and hydrogen peroxide.

The exposure mask thus formed has a semi-transparent film which comprises the silicon nitride film and silicon layers in the device pattern zone, and also has a light shielding film including the Cr film in the zone other than the device pattern zone.

Accordingly, since at least that area of the non-device pattern zone where light reaches the wafer through the transfer, acts to shield the exposure light, even when exposure is carried out a plurality of times, too narrowed pattern or insufficient focal depth can be prevented.

EMBODIMENT 17

In the foregoing embodiment, explanation has been made as to the case where the semi-transparent film and the light shielding film both forming the phase shift layer are formed on the exposure mask substrate. In the present embodiment, explanation will be directed to a method for forming a phase shift layer pattern in which, with use of the exposure mask substrate having the Cr film 92 and the CrO film 93 formed thereon, a frame, i.e., a light shielding pattern for a non-pattern zone is formed and then the phase shift layer pattern is formed.

First, as shown in FIG. 11(*a*), an electron beam resist film 94 of 500 nm thick was formed on a exposure mask substrate which has a silicon oxide substrate 90 of 2.5 mm thick and the Cr and CrO films 92 and 93 formed thereon, and further an electrically conductive film 95 of 200 nm thick is coated thereon.

Subsequently, as shown in FIG. 11(*b*), the resultant substrate was subjected to a pattern drawing operation of a pattern exposure system with use of an electron beam based on data about the alignment mark M and the formation of the light shielding film for the non-device pattern zone, and then subjected to a developing process to form a resist pattern. Even in this case, the substrate was subjected to the pattern drawing operation from above the electrically conductive film with use of the electron beam and then subjected to the developing process to form the resist pattern.

As shown in FIG. 11(*c*), the resultant substrate was next subjected to a reactive ion etching process with use of a $Cl_2$ gas and with the resist pattern used as a mask to remove the Cr and CrO films exposed from the resist pattern, and then the resist pattern was removed. In this way, the alignment mark M and the light shielding film for the non-device pattern zone were formed. Thereafter, as shown in FIG. 11(*d*), the resultant substrate was subjected a reactive sputtering process in a nitrogen atmosphere with use of a silicon target to deposit a uniform silicon nitride film $SiN_{0.6}$ of 75 nm with 0.6 mol of nitrogen to one mol of Si. In this case, the silicon nitride film $SiN_{0.6}$ is designed so that the film has a light phase of 254 degrees there in with respect to the i-ray light of the mercury lamp and is delayed by a phase of 180 degrees with respect to the light traveling through an air layer of 75 nm thick and having a light phase of 74 degrees. The silicon nitride film $SiN_{0.6}$ 91 had an amplitude transmissivity of 3% with respect to the i-ray light.

And as shown in FIG. 11(*e*), an electron beam resist film 96 of 500 nm thick was formed and further an electrically conductive film 97 of 200 nm thick was coated thereon.

Next, as shown in FIG. 11(*f*), the resultant substrate was subjected to a pattern drawing operation of a pattern exposure system with use of an electron beam based on the data prepared so that the resist film remains in the device pattern zone and the non-device pattern zones, and then subjected to a developing process to thereby form a resist pattern.

Subsequently, as shown in FIG. 11(*g*), the resultant substrate was subjected to reactive ion etching process with use of a mixture gas of $CF_4+O_2$ and of the resist pattern as a mask to remove the $SiN_{0.6}$ film 91.

Finally, as shown in FIG. 11(*h*), the resist pattern was removed.

The exposure mask thus formed has a semi-transparent film which comprises only the silicon nitride film in the device pattern zone, and also has a light shielding film in the non-pattern zone.

Even in this case, since at least that area of the non-device pattern zone where light reaches the wafer through the transfer, acts to shield the exposure light, even when exposure is carried out a plurality of times, too narrowed pattern or insufficient focal depth can be prevented.

The present invention is not restricted to the foregoing embodiments. Further, two sorts of semi-transparent films have been used in the embodiments, but 3 of more sorts of semi-transparent films may be employed, addition, the same semi-transparent film (made of 2 or more layers) may be stacked in plural numbers. The present invention may be modified in various ways without departing the scope of the present invention.

EMBODIMENT 18

An eighteenth embodiment directed to a g-ray half-tone type project ion exposure substrate, i.e., preparation of an exposure mask. FIG. 19 shows a desired pattern. A pattern MA in FIG. 19 is an alignment mark which is necessary for alignment with the projection exposure system or a processing substrate. FIGS. 20 to 26 show steps of a method for manufacturing the pattern.

In each of the drawings, (a) is a plan view and (b) is a cross-sectional view taken along line I—I'.

First, an Si substrate 100 was subjected to a sputtering process to deposit thereon a Cr film of 700 angstroms thick and then a $CrO_x$ of 300 angstroms thick.

Next, the resultant substrate was coated thereon with an electron beam (EB) resist (a trade name EBR-9 manufactured by Toray Industries, Inc.) film of 0.5 μm thick, subjected to a pattern drawing operation of a pattern exposure system with use of an electron beam, and then subjected to a developing process to form a resist pattern thereon.

The resultant substrate was next subjected to a wet etching process with use of an ammonium cerium(IV) nitrate solution with this resist pattern used as a mask to form a $Cr/CrO_x$ pattern 101. The then-formed Cr pattern 101 was formed to be larger than a desired dimension by an amount corresponding to an alignment accuracy at the time of the pattern formation through a second pattern drawing operation (to be explained later), e.g., by 0.2 μm (refer to FIG. 20).

Subsequently, the resultant substrate was subjected to a sputtering process to controllably deposit an Si film 102 of 610 angstroms thick over the entire surface of the substrate. The thickness of the then Si film was set in accordance with an equation $(2k+1) \lambda/(n-1)$ (where, λ: the wavelength of the exposure light, n: refractive index, k: integer) so that light passed through the Si film 102 had a phase difference of 180 degrees with respect to light passed through the Si substrate 100. The Si film 102 had a refractive index n of 4.57 and an attenuation coefficient a of $2.80 \times 10^{-3}$ $A^{-1}$) with respect to the g-ray light (λ=436 nm) of the mercury lamp. When the attenuation coefficient term is added to the above equation, a closer film thickness causing a phase difference of 180 degrees can be calculated. The Si film formed in the present embodiment had an intensity transmissivity of 15% with respect to the g-ray light (refer to FIG. 21).

The resultant substrate was formed thereon with an electron beam resist (a trade name SAL-601 manufactured by Shipley K.K.) film 103 of 0.5 μm thick thereon, and then with an electrically conductive film 104 of 0.2 μm thick thereon for prevention of charge-up during the pattern drawing of the electron beam (refer to FIG. 22).

The electrically conductive film 104 and electron beam resist film 103 were then subjected to a pattern drawing operation of a pattern exposure system with use of an electron beam at 3 μJ/cm$^2$.

Next, the resultant substrate was subjected to a developing process to form a resist pattern 105. The then-formed pattern includes all the light shielding and semi-transparent parts (refer to FIG. 23).

Subsequently, the resultant substrate was subjected to a reactive ion etching (RIE) process with use of a mixture gas of $CF_4$ and $O_2$ and with use of the formed resist pattern 105 as a mask to remove the Si film 106 corresponding to the opening of the resist (refer to FIG. 24).

Further, the resultant substrate was subjected to a RIE process with use of a mixture gas of $Cl_2$ and $O_2$ to remove the $CrO_x$ film 107 corresponding to the opening of the resist refer to FIG. 25).

The resist was then removed to form a desired pattern 108 and a desire semi-transparent film pattern 102. The thickness of the semi-transparent film pattern 102, as already explained above, is controlled so that the light passed through the pattern has a phase difference of 180 degrees with respect to the light passed through the substrate. Accordingly, when a light amplitude of the opposite phase thereto is added, the light intensity becomes zero at the edge portion of the shifter and thus a finer pattern than the prior art can be formed (refer to FIG. 26).

In the present technique, the formation of the Si film forming the phase shifter may be carried out by chemical vapor deposition (CVD) process or the like. Further, the thickness of the Si film may be changed, so long as the phase difference with the substrate lies with in such a range that causes resolution improving effect.

In the case where it is desired to form a mask pattern wholy as a fine pattern according to the present invention, even when the $CrO_x$/Cr film is replaced by a semi-transparent Si film of 610 angstroms thick, favorable results can be obtained.

Furthermore, it is also possible, in place of the material Si, to use such material as SiN or Ge which has similar film properties such as transmissivity and refractive index.

With use of thus formed mask, a wafer was coated with a positive resist (a trade name PFR-GX250 manufactured by Nippon Gousei Gomu K.K.) of 1.3 μm thick, and then subjected to a reduction projection exposure process of a g-ray light stepper (projection aligner) (NA=0.54, σ=0.5). In this case, an alignment mark MA on the present mask was used for alignment with the projection aligner or the processing substrate.

As a result, a 0.45 μm pattern, which had had a focus margin of 0.2 μm in the prior art, was improved to 1.0 μm in focus margin in the present invention.

Further, with respect to a relatively wide light shielding pattern, in the prior art, the side lobe influence causes the increase of light intensity in the central part of the pattern, which also influences the resist pattern, whereby, when positive resist is employed, pits are generated in the central part of the resist pattern. However, when the mask of the present invention was used, even a 1.2 μm pattern could be formed without causing any pits in its central part.

In addition, in the prior art, a positional shift in a pattern was 0.15 μm on the projected substrate (0.03 μm on the transferred substrate); whereas, in the present technique, a positional shift in the pattern formed with use of the light shielding and semi-transparent films was below its measurement limit.

EMBODIMENT 19

A nineteenth embodiment is directed to formation of a g-ray shifter edge type exposure mask. In the present embodiment, explanation will be made as to another method for preparing the same exposure substrate as used in the explanation of the eighteenth embodiment. FIG. 19 shows a desired pattern. A pattern MA in FIG. 19 is an alignment mark which is necessary for alignment with the projection aligner or a processing substrate. FIGS. 27 to 30 show steps of a method for manufacturing the pattern. In each of view of the drawings, (a) is a plan and (b) is a cross-sectional view taken along line II—II'.

First, formed on an Si substrate 200 were a Cr film of 700 angstroms thick and then a $CrO_x$ of 300 angstroms thickness.

Next, the resultant substrate was coated thereon with an electron beam (EB) resist (a trade name EBR-9 manufactured by Toray Industries, Inc.) film of 0.5 μm thick, subjected to a first pattern drawing operation of a pattern exposure system with use of an electron beam, and then subjected to a developing process to form a resist pattern thereon.

The resultant substrate was next subjected to a wet etching process with use of an ammonium cerium(IV) nitrate solution with this resist pattern used as a mask to form a Cr/$CrO_x$ pattern 201. The pattern 201 was formed to be larger than a desired dimension by an amount corresponding to an alignment accuracy at the time of the pattern formation through a second pattern drawing operation (to be explained later), e.g., by 0.2 μm (refer to FIG. 27).

Next, the resultant substrate was coated thereon with an i-ray resist film of 0.8 μm thick, subjected to an exposure process by an optical aligner, and then subjected to a developing process to form a resist pattern 205 in a zone other than a desired pattern to be formed.

Subsequently, the resultant substrate was subjected to a sputtering process to controllably deposit an $SiO_2$ film of 610 angstroms thick in the opening of the resist pattern. The formed $SiO_2$ film $2O_2$ had a intensity transmissivity of about 100% with respect to the g-ray light (refer to FIG. 28).

Next, the $SiO_2$ film $2O_2$ on the resist and the resist film 205 were removed. The then-formed $SiO_2$ film 202 includes all the light shielding and semi-transparent parts (refer to FIG. 29).

Subsequently, the resultant substrate was subjected to a reactive ion etching (RIE) process with use of a mixture gas of $Cl_2$ and $O_2$ to remove the $CrO_x$/Cr film 207 corresponding to the opening of the $SiO_2$ and to form a de sired pattern 208 and a desire semi-transparent film pattern 202. The thickness of the semi-transparent film pattern 202, as already explained above, is controlled so that the light passed through the pattern has a phase difference of 180 degrees with respect to the light passed through the substrate. Accordingly, when a light amplitude of the opposite phase thereto is added, the light intensity becomes ZeFO at the edge portion of the shifter and thus a finer pattern than the prior art can be formed (refer to FIG. 30).

In the present technique, the formation of the $SiO_2$ shifter film may be carried out by a chemical vapor deposition (CVD) process or the like. Further, the thickness of the $SiO_2$ film may be changed without departing from the subject matter of the present invention.

Furthermore, it is also possible, in place of the material $SiO_2$, to use such material as $MgF_2$ or $CaF_2$ which has similar film properties such as transmissivity and refractive index.

With use of thus formed mask, a wafer was coated thereon with a positive resist (a trade name PFR-GX250 manufactured by Nippon Gousei Gomu K.K.) of 1.3 μm thick, and then subjected to a projection exposure process of a g-ray light stepper (projection aligner) (NA=0.54, σ=0.5). In this case, an alignment mark 10 on the mask was used for alignment with the projection aligner or the processing substrate.

As a result, a 0.45 μm pattern, which had had a focus margin of 0.2 μm in the prior art, was improved to 1.0 μm in focus margin in the present invention.

Further, with respect to a relatively wide light shielding pattern, in the prior art, the side lobe influence causes the increase of light intensity in the central part of the pattern, which also influences the resist pattern, whereby, when positive resist is employed, pits are generated in the central part of the resist pattern. However, when the mask of the present invention was used, even a 1.2 μm pattern could be formed without causing any pits in its central part.

In addition, in the prior art, a positional shift in a pattern was 0.15 μm on the projected substrate (0.03 μm on the transferred substrate); whereas, in the present technique, a positional shift in the formed pattern was below its measurement limit.

EMBODIMENT 20

A twentieth embodiment is directed to an i-ray half-tone type exposure substrate. As in the embodiments 18 and 19, the present embodiment is to form such a pattern as shown in FIG. 19. A pattern MA in FIG. 19 is an alignment mark which is necessary for alignment with the projection exposure system or a processing substrate. FIGS. 31 to 37 show steps of a method for manufacturing the pattern. In each of the drawings, (a) is a plan view and (b) is a cross-sectional view taken along line III—III'.

First, formed on an Si substrate 300 were a Cr film of 700 angstroms thick and then a $CrO_x$ of 300 angstroms thickness.

Next, the resultant substrate was formed thereon with an electron beam (EB) resist (a trade name EBR-9 manufactured by Toray Industries, Inc.) film of 0.5 μm thick, subjected to a first pattern drawing operation of a pattern exposure system with use of an electron beam, and then subjected to a developing process to form a resist pattern thereon. The resultant substrate was next subjected to a wet etching process with use of an ammonium cerium(IV) nitrate solution with this resist pattern used as a mask to form a $Cr/CrO_x$ pattern 301. The then-formed Cr pattern was formed to be larger than a desired dimension by an amount corresponding to an alignment accuracy at the time of the pattern formation through a second pattern drawing operation (to be explained later), e.g., by 0.2 μm (refer to FIG. 31).

Next, an Si film 302 of 370 angstroms thick was controllably formed, for example, so that the film has an amplitude transmissivity of 16% with respect to the i-ray light.

Further formed on the film 302 was an $SiO_2$ film 303 of 1500 angstroms. A then-formed stacked film of the Si and $SiO_2$ layers had a phase difference of 180 degrees and an intensity transmissivity of 1.5% with respect to the i-ray light of the mercury lamp (refer to FIG. 32).

Next, the resultant substrate was formed thereon with an electron beam resist (a trade name SAL-601 manufactured by Shipre K.K.) film 304 of 0.5 μm thick thereon, and then with an electrically conductive film 305 of 0.2 μm thick thereon for prevention of charge-up during the pattern drawing of the electron beam (refer to FIG. 33).

Subsequently, the resultant substrate was subjected to a reactive ion etching (RIE) process with use of a $CF_4$ gas and with use of the formed resist pattern 306 as a mask to remove the $SiO_2$ film 307 corresponding to the opening of the resist, and further subjected to a RIE process with use of a mixture gas of $CF_4$ and $O_2$ to remove the Si film 308 corresponding to the opening of the resist (refer to FIG. 35).

Further, the resultant substrate was subjected to a RIE process with use of a mixture gas of $Cl_2$ and $O_2$ to remove the $CrO_x/Cr$ film 309 corresponding to the opening of the resist (refer to FIG. 36).

Next, the resist film 306 was removed to form a desired pattern 310 and a desired semi-transparent film pattern 311. The thickness of the semi-transparent film pattern 311, as already explained above, is controlled so that the light passed through the pattern has a phase difference of 180 degrees with respect to the light passed through the substrate. Accordingly, when a light amplitude of the opposite phase there to is added, the light intensity becomes zero at the boundary with the substrate and thus a finer pattern than the prior art can be formed (refer to FIG. 37).

In the present technique, the formation of the shifter film comprising the Si and $SiO_2$ layers may be carried out by a chemical vapor deposition (CVD) process or the like. Further, the thicknesses of the Si and $SiO_2$ films may be changed without departing from the subject matter of the present invention.

Furthermore, it is also possible, in place of the material Si, to use such material similar thereto in its film properties (such as transmissivity and refractive index) as SiN and Ge.

With use of thus formed mask, a wafer was coated thereon with a positive resist (a trade name PFR-iX500 manufactured by Nippon Gousei Gomu K.K.) of 1.3 μm thick, and then subjected to a projection exposure process of an i-ray light stepper (projection aligner) (NA=0.5, σ=0.5). In this case, an alignment mark 10 on the present mask was used for alignment with the projection aligner or the processing substrate.

As a result, a 0.35 μm pattern, which had had a focus margin of 0.2 μm in the prior art, was improved to 1.0 μm in focus margin in the present invention.

Further, with respect to a relatively wide light shielding pattern, in the prior art, the side lobe influence causes the increase of light intensity in the central part of the pattern, which also influences the resist pattern, whereby, when positive resist is employed, pits are generated in the central part of the resist pattern. However, when the mask of the present invention was used, even a 1.2 μm pattern could be formed without causing any pits in its central part. In addition, in the prior art, a positional shift in a pattern was 0.15 μm on the projected substrate (0.03 μm on the transferred substrate); whereas, in the present technique, a positional shift in the pattern formed with use of the light shielding and semi-transparent films was below its measurement limit.

EMBODIMENT 21

A twenty-first embodiment is directed to a g-ray shifter edge type exposure mask. As in the embodiments 18 to 20, the present embodiment is to form such a pattern as shown in FIG. 19. A pattern MA in FIG. 19 is an alignment mark which is necessary for alignment with the projection exposure system or a processing substrate. FIGS. 38 to 44 show steps of a method for manufacturing the pattern. In each of the drawings, (a) is a plan view and (b) is a cross-sectional view taken along line IV—IV'.

First, formed on an Si substrate 400 were a Cr film of 700 angstroms thick and then a $CrO_x$ of 300 angstroms thickness.

Next, the resultant substrate was formed thereon with an electron beam resist (a trade name EBR-9 manufactured by Toray Industries, Inc.) film of 0.5 μm thick, subjected to a first pattern drawing operation of a pattern exposure system with use of an electron beam, and then subjected to a developing process to form a resist pattern thereon.

The resultant substrate was next subjected to a wet etching process with use of an ammonium cerium(IV) nitrate solution with this resist pattern used as a mask to form a $Cr/CrO_x$ pattern 401. The Cr pattern 401 was formed to be larger than a desired dimension by an amount corresponding to an alignment accuracy at the time of the pattern formation through a second pattern-drawing operation (to be explained later), e.g., by 0.2 μm (refer to FIG. 38).

Next, i-ray resist was coated to be 0.8 μm thick and the resultant substrate was subjected to an exposure process of an optical aligner to form a resist pattern 402 (refer to FIG. 39).

The resultant substrate was subjected to a liquid phase growth process to deposit an $SiO_2$ film 403 of 610 angstroms on the opening of the resist pattern (refer to FIG. 40), and then the resist pattern 402 was removed. The then-formed $SiO_2$ film 403 had a intensity transmissivity of 100% with respect to the g-ray light. Further the $SiO_2$ pattern 403 was formed to be larger than a desired dimension by an amount corresponding to an alignment accuracy at the time of the pattern formation through a third pattern drawing operation (to be explained later), e.g., by 0.2 μm (refer to FIG. 41).

Figures 42, 42A:
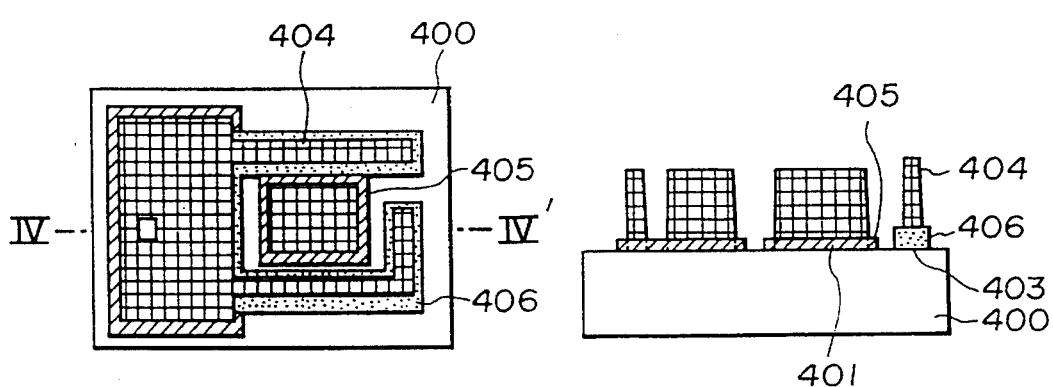
Figures 43A, 43B:
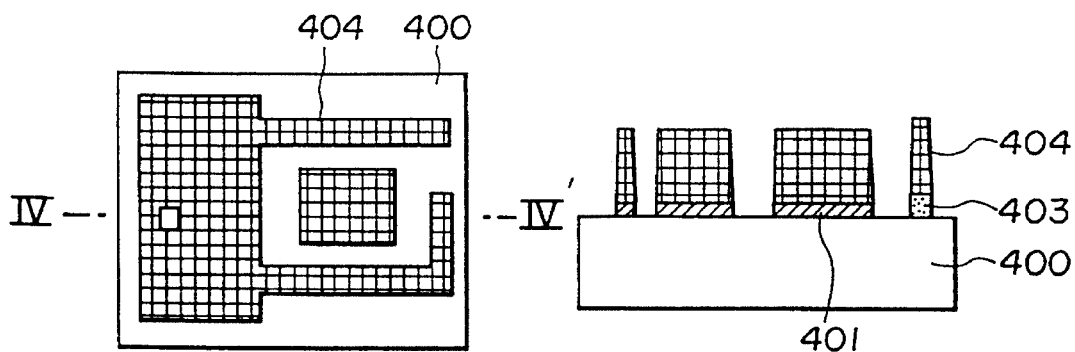
Figures 44A, 44B:
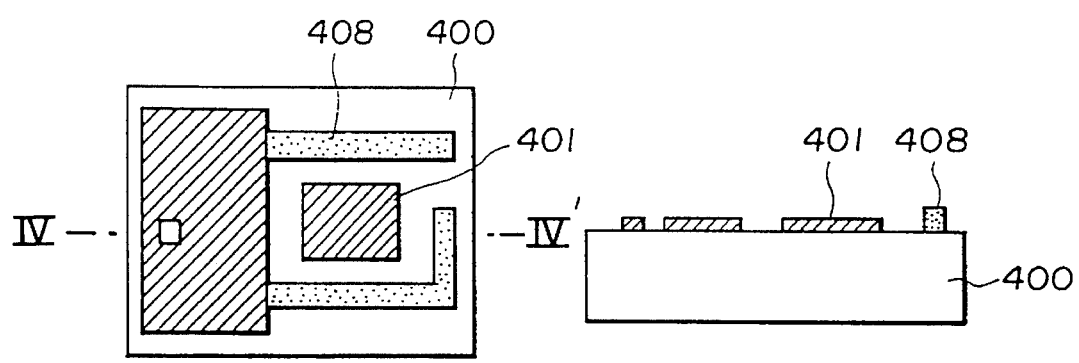

Subsequently, i-ray resist was coated thereon to be 0.8 μm thick, and the resultant substrate was subjected to a third exposure process by an optical aligner, and then subjected to a developing process to form a resist pattern 404 (refer to FIG. 42).

Then, the resultant substrate was subjected to a reactive ion etching process with use of a $Cl_2$ gas to remove the $CrO_x/Cr$ film 405 and $SiO_2$ film 406 projected from the resist pattern formed through the third exposure (refer to FIG. 43).

Next, the resist film was removed to form a desired pattern 401 and a desired semi-transparent film pattern 408. The thickness of the semi-transparent film pattern 408, as already explained above, is controlled so that the light passed through the pattern has a phase difference of 180 degrees with respect to the light passed through the substrate. Accordingly, when a light amplitude of the opposite phase thereto is added, the light intensity becomes zero at the boundary with the substrate and thus a finer pattern than the prior art can be formed (refer to FIG. 44).

In the present technique, the formation of the $SiO_2$ shifter film may be carried out by a chemical vapor deposition (CVD) process or the like.

Further, the thickness of the $SiO_2$ film may be changed without departing from the subject matter of the present invention.

Furthermore, it is also possible, in place of the material $SiO_2$, to use such material as $MgF_2$ or $CaF_2$ which has similar film properties such as transmissivity and refractive index.

With use of thus formed mask, a wafer was coated thereon with a positive resist (a trade name PFR-GX250 manufactured by Nippon Gousei Gomu K.K.) of 1.3 μm thick with use of the present mask, and then subjected to projection exposure process of a g-ray light stepper (projection aligner) (NA=0.54, σ=0.5)

As a result, a 0.45 μm pattern, which had had a focus margin of 0.2 μm in the prior art, was improved to 1.0 μm in focus margin in the present invention.

Further, with respect to a relatively wide light shielding pattern, in the prior art, the side lobe influence causes the increase of light intensity in the central part of the pattern, which also influences the resist pattern, whereby, when positive resist is employed, pits are generated in the central part of the resist pattern. However, when the mask of the present invention was used, even a 1.2 μm pattern could be formed without causing any pits in its central part. In addition, in the prior art, a positional shift in a pattern was 0.15 μm on the projected substrate (0.03 μm on the transferred substrate); whereas, in the present technique, a positional shift in the pattern formed with use of the light shielding and semi-transparent films was below its measurement limit.

Our experiments have showed that, in the present embodiment, it is desirable for the intensity transmissivity at the exposure wavelength of the light transmissive substrate to be above 60% and also for the intensity transmissivity of the transparent part to the light transmissive substrate to be above 90%. Further, the intensity transmissivity of the semi-transparent part to the light transmissive substrate is desirably between 1 and 15%.

I t has also been found that, when the phase of exposure light passing through the phase shifter made of the transparent film or a semi-transparent film satisfies a relationship of {180 degrees×(2n+1) 10 degrees)} (n: integer) with respect to the phase of exposure light passing through the transparent substrate, an improved resolution based on the phase shift and an enlargement in the focus margin can be favorably realized.

In this way, in accordance with the present invention, with regard to a pattern made of a plurality of semi-transparent films to be used as an exposure mask, when at least one sort of identical atoms are included in each of the films, there can be realized an exposure mask which can simplify its manufacturing steps and can exhibit its phase shift effects to its maximum level.

Further, in the present invention, for the purpose of preventing leakage of irradiation light passed through the semi-transparent film into a non-pattern zone, the transmissivity of the non-pattern zone is set to be below 5%. As a result, highly reliable pattern formation can be realized while preventing double exposure and avoiding the formation of a too narrowed pattern.

In addition, when a pattern made of a first film is made larger than a desired dimension by an amount corresponding to an exposure alignment accuracy, a pattern made of a second film is formed to have the desired dimension, and then parts of the first film projected from the second film is removed with the second pattern used as a mask; an exposure mask having a good positioning accuracy between the first and second patterns can be formed.

What is claimed is:

1. An exposure mask comprising a light transmissive substrate and a semi-transparent film pattern on said substrate; a ratio of an optical path length of the semi-transparent film pattern to a wavelength of exposure light being differentiated by a predetermined amount from that of a transparent part of the light transmissive substrate, and the semi-transparent film pattern comprising a plurality of laminated layers of different composition materials each containing at least one identical element of Si, Ge, and a metal element.

2. A pattern forming method wherein a desired pattern is transferred by a projection aligner at a photosensitive object with the exposure mask as set forth in claim 1.

3. A pattern forming method wherein a photosensitive object is disposed adjacent to the exposure mask as set forth in claim 1 and a desired pattern is transferred to the photosensitive object by a projection aligner.

4. A pattern forming method wherein a photosensitive object is disposed adjacent to the exposure mask as set forth in claim 1 and a desired pattern is transferred to the photosensitive object by a projection aligner.

5. An exposure mask comprising:

a light transmissive substrate; and a semi-transparent film on the light transmissive substrate and adjusted so that a phase caused by a thickness d of the semi-transparent film at a wavelength of exposure light is differentiated by $\lambda/2$ with respect to an optical path length caused by air of same thickness, the semi-transparent film being formed with laminated layers of different composition materials respectively containing an identical element.

6. An exposure mask comprising:

a light transmissive substrate; and a semi-transparent film on the light transmissive substrate and adjusted so that a phase caused by a thickness d of the semi-transparent film at a wavelength of exposure light is differentiated by $\lambda/2$ with respect to an optical path length caused by air of same thickness, the semi-transparent film being formed with laminated layers of different composition materials respectively containing at least one identical element of Si, Ge, and a metal element.

7. The exposure mask as set forth in claim 6, wherein the metal element is Cr, Al, or Ti.

8. An exposure mask having mask patterns formed on a light transmissive substrate, each mask pattern having one image pattern, the mask patterns comprising:

a semi-transparent pattern zone comprising a first semi-transparent film comprising at least one layer, an optical path length of the semi-transparent pattern zone relative to a wavelength of exposure light having a ratio differentiated by a predetermined amount from that of a transparent part of the light transmissive substrate; and a light shielding pattern zone comprising a light shielding film having an identical pattern to the semi-transparent film, stacked on a partial zone of the semi-transparent film so that edges of the semi-transparent film and edges of the light shielding film are aligned, wherein the first semi-transparent film and the light shielding film are formed by a sputtering method using an identical material as a target and comprise thin film layers of different composition materials, each containing one or more elements of the target as a common element, and wherein the first semi-transparent film is formed while controlling a refractive index n, an attenuation coefficient k and a thickness d to yield a predetermined phase difference and amplitude transmissivity T by modulating stoichiometry and thickness, and wherein the light shielding film is formed while controlling the attenuation coefficient k and a thickness d by modulating stoichiometry and thickness.

9. A pattern forming method wherein a desired pattern is transferred by a projection aligner at a photosensitive object with the exposure mask as set forth in claim 8.

10. An exposure mask having mask patterns formed on a light transmissive substrate, each mask pattern having one image pattern, the mask patterns comprising:

a semi-transparent pattern zone comprising a first semi-transparent film comprising at least one layer, an optical path length of the semi-transparent pattern zone relative to a wavelength of exposure light having a ratio differentiated by a predetermined amount from that of a transparent part of the light transmissive substrate; and a light shielding pattern zone comprising a light shielding film having an identical pattern to the semi-transparent film, stacked on a partial zone of the semi-transparent film so that edges of the semi-transparent film and edges of the light shielding film are aligned, wherein the first semi-transparent film and the light shielding film are formed by a chemical vapor deposition (CVD) method using reactive gases each containing one or more identical elements and comprise thin film layers of different composition materials each containing a common element, and wherein the first semi-transparent film is formed while controlling a refractive index n, an attenuation coefficient k and a thickness d to yield a predetermined phase difference and amplitude transmissivity T by modulating stoichiometry and thickness, and wherein the light shielding film is formed while controlling an attenuation coefficient k and a thickness d by modulating stoichiometry and thickness.

11. An exposure mask comprising:

a light transmissive substrate;

a semi-transparent pattern comprising a first semi-transparent film on the substrate comprising at least one layer, the first semi-transparent film having a phase difference with a transparent part of the light transmissive substrate set within a range of 180±10 degrees and amplitude transmissivity of 10 to 40%; and a light shielding layer or a second semi-transparent film having an amplitude transmissivity of 10 to 40% and having an identical pattern to the semi-transparent pattern, the light shielding layer or the second semi-transparent film being stacked on a partial zone of the semi-transparent pattern so that edges of the semi-transparent pattern and edges of the light shielding layer or the second semi-transparent film are aligned, and the partial zone having an amplitude transmissivity of less than 5%, wherein the first semi-transparent film and either one of the light shielding film and the second semi-transparent film are formed by a sputtering method using an identical material as a target and comprise thin film layers of different composition materials each containing one or more elements of the target as a common element.

12. An exposure mask as set forth in claim 11, wherein said partial zone at least includes an outer peripheral part of a zone which contributes as a semiconductor element when transferred onto a wafer.

13. A pattern forming method wherein a desired pattern is transferred by a projection aligner at a photosensitive object with the exposure mask as set forth in claim 12.

14. A pattern forming method wherein a photosensitive object is disposed adjacent to the exposure mask as set forth in claim 12 and a desired pattern is transferred to the photosensitive object by a projection aligner.

15. A pattern forming method wherein a desired pattern is transferred by a projection aligner at a photosensitive object with the exposure mask as set forth in claim 11.

16. A pattern forming method wherein a photosensitive object is disposed adjacent to the exposure mask as set forth in claim 11 and a desired pattern is transferred to the photosensitive object by a projection aligner.

17. A mask blank for fabricating an exposure mask having mask patterns each having one image pattern, the exposure mask comprising:

a light transmissive substrate;

a first semi-transparent film on the substrate and comprising at least one layer, the first semi-transparent film having a phase difference with a transparent part of the light transmissive substrate set within a range of 180±10 degrees and an amplitude transmissivity of 10 to 40%;

a light shielding layer or a second semi-transparent film having an amplitude transmissivity of 10 to 40% stacked on at least a partial surface of the first semi-transparent film and adjusted so that the surface has an overall amplitude transmissivity of below 5%; and an oxide film disposed between the first semi-transparent film and one of the light shielding layer and the second semi-transparent film, wherein the first semi-transparent film and one of the light shielding layer and the second semi-transparent film are formed by a sputtering method using an identical material as a target and comprise thin film layers of different composition materials containing one or more elements of the target as a common element, and wherein the mask patterns are formed in such a manner that the light shielding film or the second semi-transparent film is stacked on a partial zone of the first semi-transparent film so that edges of the first semi-transparent film and edges of the light shielding layer or the second semi-transparent film are aligned, and patterned so that the light shielding layer or the second semi-transparent film and the first semi-transparent film have an identical pattern, and wherein the first and second semi-transparent films are formed while controlling a refractive index n, an attenuation coefficient k and a thickness d, respectively to yield a predetermined phase difference and amplitude transmissivity T by modulating stoichiometry and thickness, and wherein the light shielding film is formed while controlling an attenuation coefficient k and a thickness d by modulating stoichiometry and thickness.

18. A mask blank for fabricating an exposure mask having mask patterns each having one image pattern, the exposure mask comprising:

a light transmissive substrate;

a first semi-transparent film on the substrate and comprising at least one layer, the first semi-transparent film having a phase difference with a transparent part of the light transmissive substrate set within a range of 180±10 degrees and an amplitude transmissivity of 10 to 40%;

a light shielding layer or a second semi-transparent film having an amplitude transmissivity of 10 to 40% stacked on at least a partial surface of the first semi-transparent film and adjusted so that the surface has an overall amplitude transmissivity of below 5%; and an oxide film disposed between the first semi-transparent film and one of the light shielding layer and the second semi-transparent film, wherein the first semi-transparent film and one of the light shielding film and the second semi-transparent film are formed by a chemical vapor deposition (CVD) method using reactive gases each containing one or more identical elements and comprise thin film layers of different composition materials each containing a common element, wherein the mask patterns are formed in such a manner that the light shielding film or the second semi-transparent film is stacked on a partial zone of the first semi-transparent film so that edges of the first semi-transparent film and edges of the light shielding layer or the second semi-transparent film are aligned, and patterned so that the light shielding layer or the second semi-transparent film and the first semi-transparent film have an identical pattern, and wherein the first and second semi-transparent films are formed while controlling a refractive index n, an attenuation coefficient k and a thickness d, respectively to yield a predetermined phase difference and amplitude transmissivity T by modulating stoichiometry and thickness, and wherein the light shielding film is formed while controlling an attenuation coefficient k and a thickness d by a modulating stoichiometry and thickness.

19. An exposure mask having mask patterns formed on a light transmissive substrate, each mask pattern having one image pattern, the mask patterns comprising:

a semi-transparent pattern zone comprising a first semi-transparent film comprising at least one layer, an optical path length of the semi-transparent pattern zone relative to a wavelength of exposure light having a ratio differentiated by a predetermined amount from that of a transparent part of the light transmissive substrate; and a light shielding pattern zone comprising a light shielding film having an identical pattern to the semi-transparent film, stacked on a partial zone of the semi-transparent film so that edges of the semi-transparent film and edges of the light shielding film are aligned, wherein the first semi-transparent film and the light shielding film are formed by a sputtering method using an identical material as a target and comprise thin film layers or different composition materials, each containing Si and/or Al and/or Ge elements of the target as a common element, and wherein the first semi-transparent film is formed while controlling a refractive index n, an attenuation coefficient k and a thickness d to yield a predetermined phase difference and amplitude transmissivity T by modulating stoichiometry and thickness, and wherein the light shielding film is formed while controlling an attenuation coefficient k and a thickness d by modulating stoichiometry and thickness.

* * * * *